United States Patent
Li et al.

(10) Patent No.: US 12,501,720 B2
(45) Date of Patent: Dec. 16, 2025

(54) SOLAR CELL, METHOD FOR MANUFACTURING SOLAR CELL, AND PHOTOVOLTAIC MODULE

(71) Applicant: ZHEJIANG JINKO SOLAR CO., LTD., Zhejiang (CN)

(72) Inventors: Huimin Li, Zhejiang (CN); Menglei Xu, Zhejiang (CN); Jie Yang, Zhejiang (CN); Xinyu Zhang, Zhejiang (CN)

(73) Assignee: ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 18/635,851

(22) Filed: Apr. 15, 2024

(65) Prior Publication Data

US 2025/0255011 A1 Aug. 7, 2025

(30) Foreign Application Priority Data

Feb. 7, 2024 (CN) .......................... 202410173143.6

(51) Int. Cl.
*H10F 10/174* (2025.01)
*H10F 71/00* (2025.01)
(Continued)

(52) U.S. Cl.
CPC ......... *H10F 10/174* (2025.01); *H10F 71/121* (2025.01); *H10F 77/219* (2025.01); *H10F 77/311* (2025.01); *H10F 77/707* (2025.01)

(58) Field of Classification Search
None
See application file for complete search history.

(56) References Cited

U.S. PATENT DOCUMENTS

| | | | |
|---|---|---|---|
| 2009/0286347 A1* | 11/2009 | Kim ...................... | H10F 77/219 257/E31.124 |
| 2011/0073166 A1* | 3/2011 | Lee ...................... | H10F 19/908 136/251 |

(Continued)

FOREIGN PATENT DOCUMENTS

| | | |
|---|---|---|
| AU | 2022353466 A1 | 4/2024 |
| AU | 2023278024 A1 | 11/2024 |

(Continued)

OTHER PUBLICATIONS

English language machine translation of CN-116525708-A. (Year: 2025).*

(Continued)

*Primary Examiner* — Eli S Mekhlin
(74) *Attorney, Agent, or Firm* — USCH Law, PC

(57) ABSTRACT

A solar cell, a method for manufacturing the same, and a photovoltaic module are provided. The solar cell includes a substrate, first and second doped parts, and first electrodes. The substrate has a first surface including first regions and second regions arranged alternatingly in a first direction. Each of the first and second doped parts is located on a corresponding first and second region, respectively and is separated from each other. Each first electrode and a third doped part are located on the corresponding first doped part. On the first doped part, the third doped part is located on at least one side of the first electrode in the first direction and is separated from the adjacent first electrode. The first doped parts are doped with dope elements different from the second doped parts and the third doped parts.

15 Claims, 11 Drawing Sheets

(51) Int. Cl.
  H10F 77/20 (2025.01)
  H10F 77/30 (2025.01)
  H10F 77/70 (2025.01)

(56) References Cited

U.S. PATENT DOCUMENTS

| | | | |
|---|---|---|---|
| 2013/0164878 A1 | 6/2013 | Cousins et al. | |
| 2016/0284881 A1* | 9/2016 | Johnson | H10F 77/311 |
| 2016/0284896 A1 | 9/2016 | Westerberg et al. | |

FOREIGN PATENT DOCUMENTS

| | | | | |
|---|---|---|---|---|
| CN | 101438420 A | | 5/2009 | |
| CN | 101814544 A | | 8/2010 | |
| CN | 102479864 A | | 5/2012 | |
| CN | 103296136 A | | 9/2013 | |
| CN | 212676291 U | | 3/2021 | |
| CN | 215070001 U | | 12/2021 | |
| CN | 113964216 A | | 1/2022 | |
| CN | 115172477 A | | 10/2022 | |
| CN | 115458617 A | | 12/2022 | |
| CN | 116230783 A | | 6/2023 | |
| CN | 116525708 A | * | 8/2023 | ......... H01L 31/0352 |
| CN | 116565052 A | | 8/2023 | |
| CN | 116632093 A | | 8/2023 | |
| CN | 117253929 A | | 12/2023 | |
| JP | 2015111605 A | | 6/2015 | |
| JP | 2016178290 A | | 10/2016 | |
| JP | 2017037974 A | | 2/2017 | |
| JP | 2022097253 A | | 6/2022 | |
| KR | 101149173 B1 | | 5/2012 | |
| WO | 2016158226 A1 | | 10/2016 | |
| WO | 2017098790 A1 | | 6/2017 | |
| WO | 2017203751 A1 | | 11/2017 | |
| WO | 2018168180 A1 | | 9/2018 | |
| WO | 2021230227 A1 | | 11/2021 | |
| WO | 2023045347 A1 | | 3/2023 | |
| WO | 2023050823 A1 | | 4/2023 | |
| WO | 2023050824 A1 | | 4/2023 | |
| WO | 2023213125 A1 | | 11/2023 | |

OTHER PUBLICATIONS

Zhejiang Jinko Solar Co., Ltd., CN First Office Action with English Translation, CN 2024101731436, Mar. 27, 2024, 11 pgs.

Zhejiang Jinko Solar Co., Ltd., Notification to Grant Patent Right for Invention with English translation, CN 2024101731436, Apr. 25, 2024, 6 pgs.

Zhejiang Jinko Solar Co., Ltd., Extended European Search Report, EP 24170848.6, Oct. 4, 2024, 93 pgs.

* cited by examiner

SOLAR CELL, METHOD FOR MANUFACTURING SOLAR CELL, AND PHOTOVOLTAIC MODULE

CROSS REFERENCE TO RELATED APPLICATIONS

This application claims priority to Chinese Patent Application No. CN202410173143.6, entitled "SOLAR CELL, METHOD FOR MANUFACTURING SOLAR CELL, AND PHOTOVOLTAIC MODULE," filed on Feb. 7, 2024, which is incorporated by reference herein in its entirety.

TECHNICAL FIELD

Embodiments of the present disclosure relate to the field of photovoltaic technology, and in particular, to a solar cell, a method for manufacturing a solar cell, and a photovoltaic module.

BACKGROUND

An Interdigitated Back Contact (hereinafter IBC) cell refers to a solar cell structure with a back junction and back contact and with positive and negative metal electrodes arranged on a back surface of the cell in an interdigitated manner, in which the PN junction is located on the back of the cell. The PN junctions and the metal electrodes of the IBC cell are located on the back of the cell, so there is no metal electrode, which may block the light, on the front, thus achieving a greater short-circuit current and a greater conversion efficiency. However, at present, the structure of the IBC cell is desired to be improved to improve the photoelectric conversion efficiency of the IBC cell.

SUMMARY

An embodiment of the present disclosure provides a solar cell. The solar cell includes a substrate, a plurality of first doped parts, a plurality of second doped parts, a plurality of first electrodes and a plurality of third doped parts. The substrate has a first surface and a second surface opposite to the first surface, and the first surface includes first regions and second regions arranged alternatingly in a first direction. A respective first doped part of the plurality of first doped parts is located on a corresponding first region of the first regions. A respective second doped part of the plurality of second doped parts is located on a corresponding second region of the second regions, the respective second doped part is spaced apart from a first doped part adjacent to the respective second doped part in the plurality of first doped parts, and a type of a dopant element in the plurality of second doped parts being different from a type of a dopant element in the plurality of first doped parts. A respective first electrode of the plurality of first electrodes is located on the respective first doped part and is in electrical contact with the respective first doped part. A respective third doped part of the plurality of third doped parts is located on a portion of a top surface of the respective first doped part. The respective third doped part is located on one side of the respective first electrode, and is spaced apart from the respective first electrode. A type of a dopant element in the plurality of third doped parts is different from the type of the dopant element in the plurality of first doped parts.

In some embodiments, on the respective first doped part, the respective third doped part is located on one side of the first electrode adjacent to the respective third doped part in the first direction; and a ratio of a width of the respective third doped part to a width of the respective first doped part in the first direction ranges from 0.05:1 to 0.5:1.

In some embodiments, on the respective first doped part, two third doped parts in the plurality of third doped parts are located on two opposite sides of the respective first electrode in the first direction.

In some embodiments, a ratio of a first width to a width of the respective third doped part in the first direction ranges from 0.23:1 to 68:1, and the first width is a distance between the adjacent third doped parts on the respective first doped part in the first direction.

In some embodiments, the respective third doped part has a thickness equal to a thickness of the respective second doped part.

In some embodiments, there is a gap arranged between the first doped part and the second doped part which are adjacent to each other, and a portion of the first surface is exposed in the gap.

In some embodiments, in a thickness direction of the substrate, the first surface corresponding to the first regions is level with the first surface corresponding to the second regions; or in the thickness direction of the substrate, the first surface corresponding to the first regions is not level with the first surface corresponding to the second regions, and a first height of the first surface corresponding to the first regions with respect to the second surface is greater than a second height of the first surface corresponding to the second regions with respect to the second surface.

In some embodiments, in a thickness direction of the substrate, the first surface corresponding to the first regions is not level with the first surface corresponding to the second regions, a first height of the first surface corresponding to the first regions with respect to the second surface is greater than a second height of the first surface corresponding to the second regions with respect to the second surface; and there is a gap arranged between at least a portion of the first doped parts and the second doped parts which are adjacent to each other.

In some embodiments, the solar cell further includes an insulating layer located between the plurality of third doped parts and the plurality of first doped parts.

In some embodiments, material of the insulating layer includes silicon glass material doped with a first dopant element, a type of the first dopant element is the same as the type of the dopant element in the plurality of first doped parts.

In some embodiments, the plurality of third doped parts and the plurality of second doped parts are made of the same material.

An embodiment of the present disclosure provides a method for manufacturing a solar cell. The method includes: providing a substrate having a first surface and a second surface opposite to the first surface, where the first surface includes first regions and second regions arranged alternatingly in a first direction; forming a plurality of first doped parts, wherein a respective first doped part of the plurality of first doped parts is located on a corresponding first region of the first regions, and a top surface of the respective first doped part includes a metal region; forming an initial first doped layer, wherein the initial first doped layer covers the plurality of first doped parts and the first surface corresponding to the second regions, and a type of a dopant element in the initial first doped layer is different from a type of a dopant element in the plurality of first doped parts; removing, by a laser processing, at least a portion of the initial first doped layer on the metal region to expose the metal region; taking a remaining portion of the initial first doped layer on the second regions as a plurality of second doped parts, wherein the second doped part is spaced apart from the first doped part; taking a remaining portion of the initial first doped layer on the plurality of first doped parts as a plurality of third doped parts; and forming a plurality of first electrodes, wherein a respective first electrode of the plurality of first electrodes is located on a corresponding metal region and is in electrical contact with a corresponding first doped part of the plurality of first doped parts, and the respective first electrode is spaced apart from a third doped part adjacent to the respective first electrode.

In some embodiments, forming the plurality of first doped parts includes: forming an initial substrate having a third surface and a fourth surface opposite to the third surface, wherein the third surface includes third regions and fourth regions arranged alternatingly in the first direction; forming a doping source layer covering the third regions and the fourth regions, wherein the doping source layer has target dopant elements; performing a propulsion operation to propel the target dopant elements in the doping source layer to the initial substrate to form an initial second doped layer; and removing the doping source layer and the initial second doped layer on the fourth regions, removing a portion of a thickness of the initial substrate corresponding to the fourth regions, taking a remaining portion of the initial substrate as the substrate, taking a remaining portion of the initial second doped layer on the third regions as the plurality of first doped parts, and taking a remaining portion of the doping source layer on the third region as an insulating layer; where during forming the initial first doped layer, the initial first doped layer covers the insulating layer on the plurality of first doped parts.

In some embodiments, during removing, by a laser processing, at least a portion of the initial first doped layer on the metal region, the doping source layer on the metal region is removed and the doping source layer on a region other than the metal region in the third regions is taken as the insulating layer.

In some embodiments, there are gaps arranged between at least a portion of the first regions and the second regions which are adjacent to each other; during forming the initial first doped layer, the initial first doped layer is located on the gaps; and during removing, by a laser process, at least a portion of the initial first doped layer on the metal region, the initial first doped layer on the gaps is removed.

An embodiment of the present disclosure provides a photovoltaic module. The photovoltaic module includes: at least one cell string formed by connecting a plurality of solar cells according to any one of the above embodiments or formed by connecting a plurality of solar cells manufactured by the method according to any one of the above embodiments; at least one encapsulation layer configured to cover surfaces of the at least one cell string; and at least one cover plate configured to cover surfaces of the at least one encapsulation layer away from the at least one cell string.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated. In order to more clearly explain the technical solution in the embodiments of the present disclosure or in the conventional technology, the drawings used in the embodiments are introduced briefly below. It is obvious that the drawings described below show only some embodiments of the present disclosure. The person skilled in the art can obtain other drawings based on these drawings without any creative effort.

DETAILED DESCRIPTION OF THE EMBODIMENTS

It can be seen from the BACKGROUND section that the photoelectric conversion efficiency of the current IBC cell needs to be improved.

In the technical solutions of the solar cell provided by the embodiments of the present disclosure, a first doped part and a second doped part adjacent to each other being spaced apart can avoid electric leakage between the first doped part and the second doped part. In addition, a third doped part is arranged on a portion of the top surface of the first doped part, the type of the dopant element in the third doped part is different from the type of the dopant element in the first doped part. In this way, the third doped part can provide an impurity absorption effect for the first doped part, so as to improve the photoelectric conversion efficiency of the solar cell. In addition, the third doped part being spaced apart from the first electrode is conducive to increasing a process window for preparing the first electrode, reducing a process difficulty and avoiding interference on the normal transport of carriers due to contact between the third doped part and the first electrode. The third doped part can also be acted as a protective layer for the first doped part, in the process of preparing the solar cell, the third doped part can reduce the possibility of damage to the first doped layer or reduce the introduction of impurities to the first doped layer, so as to improve the yield and quality of the solar cell.

Embodiments of the present disclosure are described in detail in conjunction with the drawings. However, it should be understood by a person of ordinary skill in the art that in the various embodiments of the present disclosure, many technical details are given in order to give the reader a better understanding of the present disclosure. However, even without these technical details and various variations and modifications based on the following embodiments, it is possible to implement the technical solution the protection for which is claimed in the present disclosure.

Figure 1:
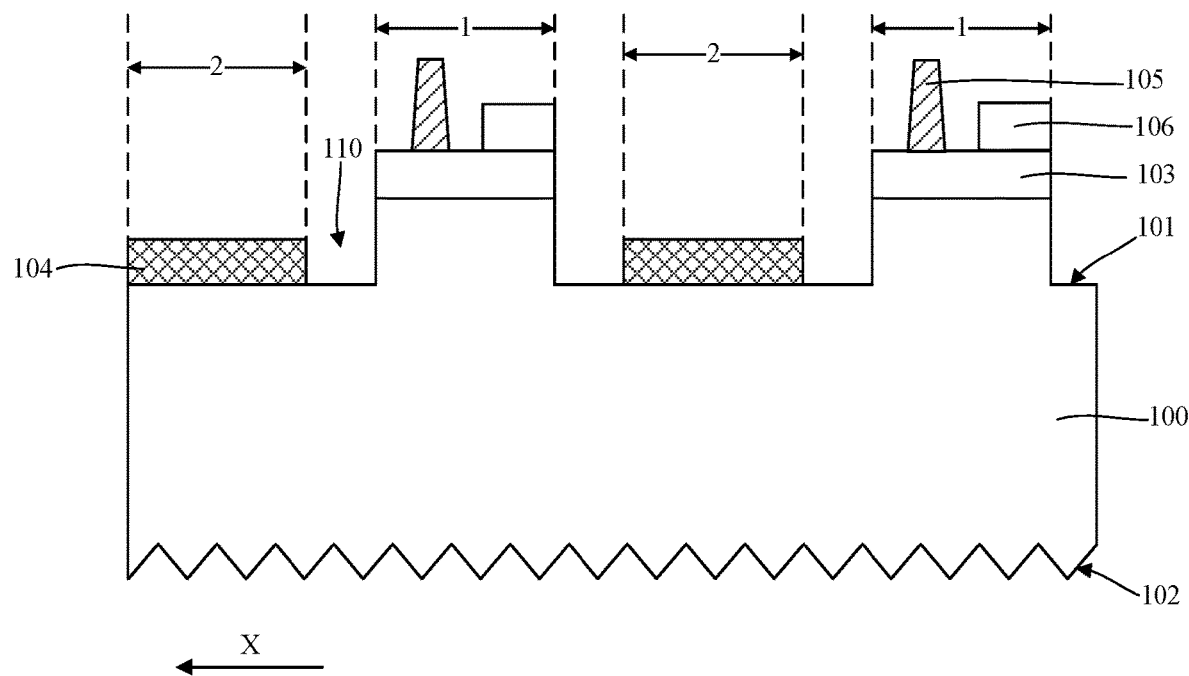
FIG. 1 is a schematic structural diagram of a first type of solar cell according to an embodiment of the present disclosure.

FIG. 1 is a schematic structural diagram of a first type of solar cell according to an embodiment of the present disclosure.

Referring to FIG. 1, the solar cell includes a substrate 100. The substrate 100 has a first surface 101 and a second surface 102 opposite to the first surface 101. The first surface 101 includes first regions 1 and second regions 2 arranged alternatingly in a first direction X. The solar cell includes multiple first doped parts 103. A respective first doped part of the multiple first doped parts 103 is located on a corresponding first region of the first regions 1. The solar cell includes multiple second doped parts 104. A respective second doped part of the multiple second doped parts 104 is located on a corresponding second region 2 of the second regions. The respective second doped part 104 is spaced apart from a first doped part 103 adjacent to the respective second doped part 104. A type of a dopant element in the second doped parts 104 is different from a type of a dopant element in the first doped parts 103. The solar cell includes multiple first electrodes 105. A respective first electrode of the multiple first electrodes 105 is located on a corresponding first doped part of the multiple first doped parts 103 and is in electrical contact with the corresponding first doped part 103. The solar cell includes multiple third doped parts 106. A respective third doped part of the multiple third doped parts 106 is located on a portion of a top surface of a corresponding first doped part of the multiple first doped parts 103. On the respective first doped part 103, the third doped part 106 is located on at least one side of the first electrode 105 in the first direction, and the third doped part 106 is spaced apart from the first electrode 105. A type of a dopant element in the third doped parts 106 is different from the type of the dopant element in the first doped parts 103.

In the technical solutions of the solar cell provided by the embodiments of the present disclosure, the first doped part 103 and the second doped part 104 being spaced apart can avoid electric leakage between the first doped part 103 and the second doped part 104. The third doped part 106, with the type of the dopant element different from the type of the dopant element in the first doped part 103, can provide an impurity absorption effect for the first doped part 103, so as to improve the photoelectric conversion efficiency of the solar cell. In addition, the third doped part being spaced apart from the first electrode is conducive to increasing a process window for preparing the first electrode, reducing a process difficulty and avoiding interference on the normal transport of carriers due to contact between the third doped part and the first electrode. The third doped part 106 can also be acted as a protective layer for the first doped part 103, in the subsequent process of the first doped layer, the third doped part 106 can reduce the possibility of damage to the first doped layer or reduce the introduction of impurities to the first doped layer, so as to improve the yield and quality of the solar cell. For example, a cleaning process is often used in the process of preparing the solar cell, the presence of the third doped part 106 can reduce the possibility of damage to the first doped layer during the cleaning process.

It should be noted that the top surface of the first doped part 103 is a surface of the first doped part 103 away from the first surface 101.

The substrate 100 is used to receive incident light and generate photo-generated carriers. In some embodiments, the substrate 100 may be a semiconductor substrate 100, which may be silicon, germanium, germanium silicon, or silicon on an insulator.

In some embodiments, the substrate 100 may be made of elemental semiconductor material. Specifically, the elemental semiconductor material consists of a single element such as silicon or germanium. The elemental semiconductor material may be monocrystalline state, polycrystalline state, amorphous state or microcrystalline state (a state being both monocrystalline and amorphous is called microcrystalline state). For example, silicon may be at least one of monocrystalline silicon, polycrystalline silicon, amorphous silicon or microcrystalline silicon. If the substrate 100 is made of silicon, the material of the substrate 100 may include at least one of monocrystalline silicon, polycrystalline silicon, amorphous silicon or microcrystalline silicon.

In some embodiments, the substrate 100 may also be made of compound semiconductor material. Common compound semiconductor material includes, but is not limited to, silicon germanide, silicon carbide, gallium arsenide, indium gallium, perovskite, cadmium telluride, copper indium selenium and other materials, and may also be silicon carbide, organic material or polynary compound. The polynary compound may include, but is not limited to, perovskite, gallium arsenide, cadmium telluride, copper indium selenium and other materials.

The substrate 100 may also be a sapphire substrate, a silicon substrate on an insulator, or a germanium substrate on an insulator.

The substrate 100 may be an N-type semiconductor substrate or a P-type semiconductor substrate. The N-type semiconductor substrate is doped with N-type dopant elements, and the N-type dopant element may be any one of group-V elements such as phosphorus (P) element, bismuth (Bi) element, antimony (Sb) element or arsenic (As) element. The P-type semiconductor substrate is doped with P-type dopant elements, and the P-type dopant element may be any one of group-III elements such as boron (B) element, aluminum (Al) element, gallium (Ga) element or indium (In) element.

The solar cell according to the embodiment of the present disclosure may be the IBC cell. In some embodiments, the solar cell is a single-sided cell, the second surface 102 of the substrate 100 is a light receiving surface for receiving incident light, and the first surface 101 of the substrate 100 is a back surface. In some embodiments, the solar cell according to the embodiment of the present disclosure may be a bifacial solar cell. That is, both the first surface 101 and the second surface 102 of the substrate 100 may be acted as the light receiving surfaces. Both the first surface 101 and the second surface 102 may be used to receive the incident light.

In some embodiments, the substrate 100 is provided with a textured structure on the second surface 102. The textured structure may include a pyramidal textured structure of regular shape and a black silicon of irregular shape. A bevel of the textured structure can increase internal reflection of the incident light, thereby improving an absorption efficiency of the incident light of the substrate 100, and thus improving the cell efficiency of the solar cell.

In some embodiments, the first surface 101 of the substrate 100 may be a polished surface. The polished surface refers to a flat surface formed by removing the textured structure of the surface through polishing solution or laser etching. After polishing, a flatness of the rear surface is increased, and the reflection of long wave light is increased, which promotes secondary absorption of the incident light, thus improving short-circuit current Isc. In addition, due to the reduction in the specific surface area of the rear surface, recombination in the rear surface is reduced, and the passivation effect of the rear surface is improved.

In some embodiments, the solar cell may further include a dielectric layer (not shown in figures) located on the first surface of the substrate. The first doped part is located on a surface of the dielectric layer, corresponding to the first regions, away from the substrate, and the second doped part is located on a surface of the dielectric layer, corresponding to the second regions, away from the substrate.

For example, the dielectric layer may be a tunneling layer. The tunneling layer can make the energy band of the first surface asymmetrically shift, so that a potential barrier of the majority carrier in the carriers is lower than a potential barrier of the minority carrier in the carriers, therefore the majority carriers can easily be quantum tunneled through the tunneling layer to be transported to the first doped part or the second doped part, while it is difficult for the minority carriers to pass through the tunneling layer. In this way, the selective transport of the carriers is achieved. In addition, the tunneling layer can also provide a chemical passivation effect for the substrate.

The tunneling layer may be made of at least one of silicon oxide, silicon nitride, silicon oxynitride, silicon carbide or magnesium fluoride.

In some embodiments, the dielectric layer may not be arranged, and the first doped part is directly in contact with the first surface corresponding to the first regions, and the second doped part is directly in contact with the first surface corresponding to the second regions.

Figure 2:
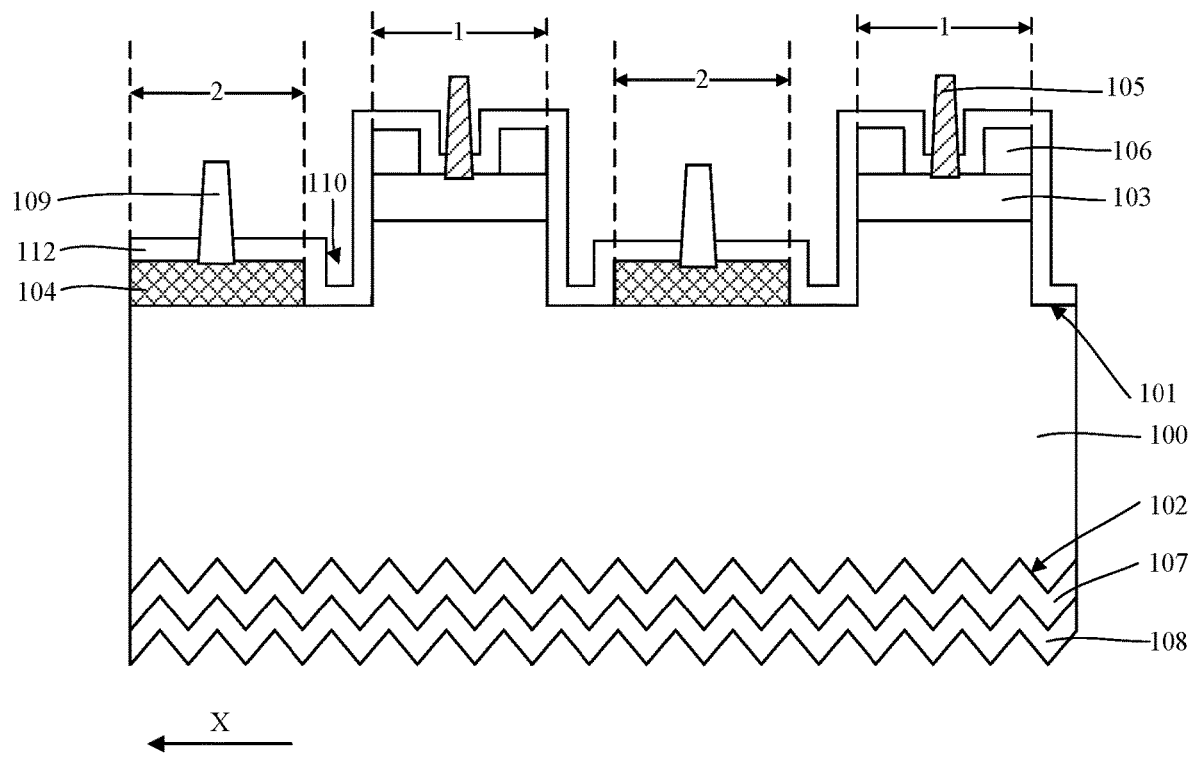
FIG. 2 is a schematic structural diagram of a second type of solar cell according to an embodiment of the present disclosure.

FIG. 2 is a schematic structural diagram of a second type of solar cell according to an embodiment of the present disclosure.

Referring to FIG. 2, in some embodiments, a front surface field (FSF) 107 is arranged on the second surface 102 of the substrate 100, and a conductive type of the dopant element in the front surface field 107 is the same as a conductive type of the dopant element in the substrate 100. Moreover, a concentration of the dopant element in the front surface field is greater than a concentration of the dopant element in the substrate 100, so that a field passivation effect can be used to reduce a surface minority concentration, thus reducing a surface recombination rate, while reducing a series resistance and improving an electron transport ability.

Referring to FIG. 2, in some embodiments, the solar cell further includes a first passivation layer 108 located on a surface of the front surface field away from the substrate 100. The first passivation layer provides a passivation effect for the second surface 102 of the substrate 100. The first passivation layer 108 may be of a single layer structure or a laminated structure. The first passivation layer 108 may be made of one or more of silicon oxide, silicon nitride, silicon oxynitride, silicon carbonitride oxide, titanium oxide, hafnium oxide, aluminium oxide or the like.

The first electrodes 105 may be made of one or more of aluminum, silver, gold, nickel, molybdenum, or copper.

Figure 3:
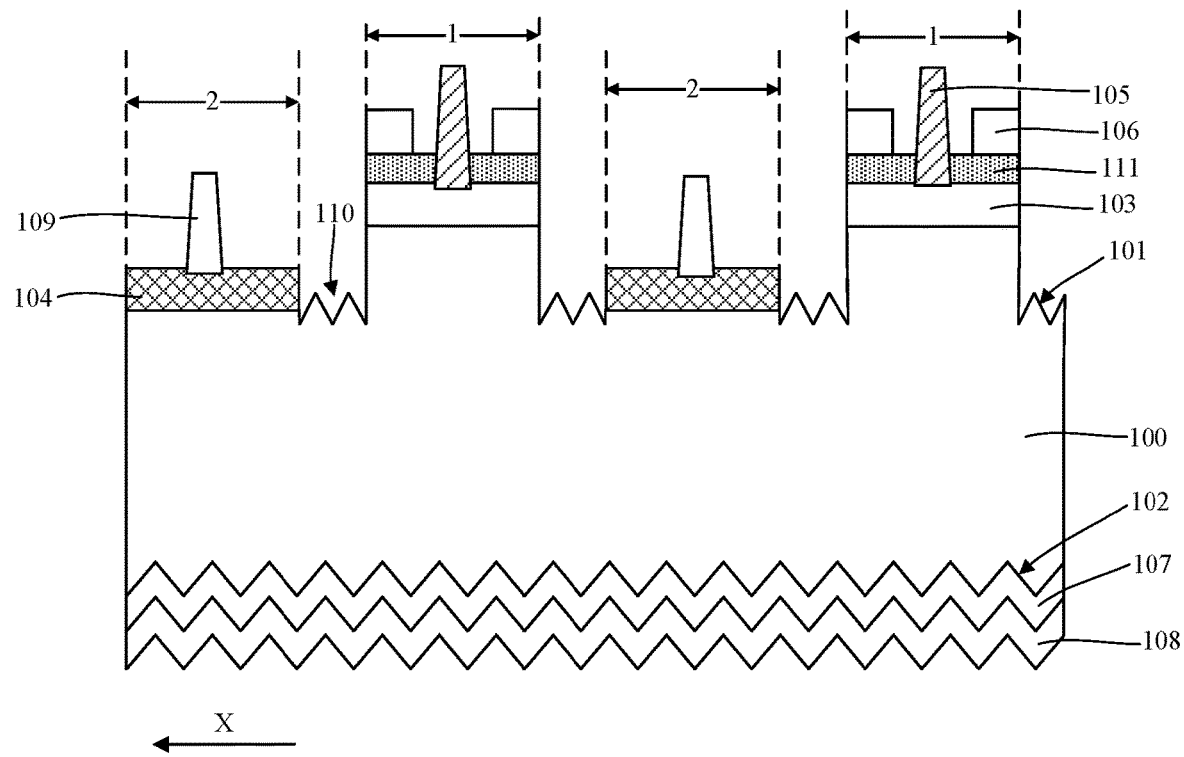
FIG. 3 is a schematic structural diagram of a third type of solar cell according to an embodiment of the present disclosure.
Figure 4:
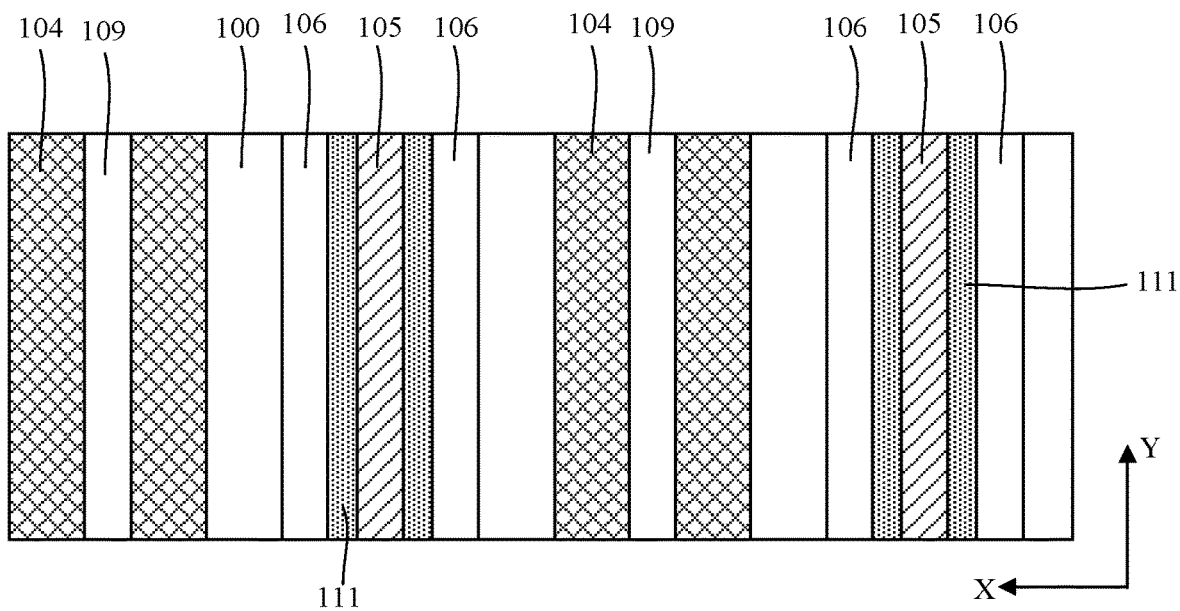
FIG. 4 is a schematic top view of a part of the solar cell shown in FIG. 3.

FIG. 3 is a schematic structural diagram of a third type of solar cell according to an embodiment of the present disclosure, and FIG. 4 is a schematic top view of a part of the solar cell shown in FIG. 3.

Referring to FIG. 3 and FIG. 4, in some embodiments, the solar cell further includes multiple second electrodes 109 located on the second doped parts 104, respective. A respective second electrode of the multiple second electrodes 109 is in electrical contact with a corresponding second doped part of the second doped parts 104. The second electrodes 109 may be made of one or more of aluminum, silver, gold, nickel, molybdenum or copper.

The first electrodes 105 and the second electrodes 109 extend along a second direction Y, and the second direction Y intersects the first direction X.

Referring to FIG. 2, the solar cell may further include a second passivation layer 112 covering top surfaces of the third doped parts 106, top surfaces of the second doped parts 104, and the top surfaces of the first doped parts 103 not covered by the third doped parts 106. The first electrodes 105 penetrate the second passivation layer 112 and are in electrical contact with the first doped parts 103. The second electrodes 109 penetrate the second passivation layer 112 and are in electrical contact with the second doped parts 104.

In some embodiments, the type of the dopant element in the first doped parts 103 may be the same as the type of the dopant element in the substrate 100, the concentration of the dopant element in the first doped parts 103 is greater than the concentration of the dopant element in the substrate 100, and the first doped parts 103 and the substrate 100 form high-low junctions. A built-in electric field, pointing from the first doped parts 103 to the inside of the substrate 100, is formed in the high-low junction. Under the action of the built-in electric field, minority carriers drift to escape from the interface, the recombination rate of the carriers at the interface of the substrate 100 is reduced, thereby enhancing the open circuit voltage, the short circuit current and the fill factor of the solar cell and improving the photoelectric conversion efficiency of the back contact solar cell. The type of the dopant element in the second doped parts 104 may be opposite to the type of the dopant element in the substrate 100, so that the second doped parts 104 and the substrate 100 form PN junctions. The type of the dopant element in the third doped parts 106 is opposite to the type of the dopant element in the first doped parts 103.

For example, the dopant element in the substrate 100 may be a P-type dopant element, then the dopant element in the first doped parts 103 may be the P-type dopant element, and the second doped parts 104 and the third doped parts 106 are doped with N-type dopant elements. It should be understood that in the process of preparing the solar cell, due to the limitations of the process environment and process equipment and other factors, it is easy to introduce metal impurities into the solar cell, the metal impurities may affect the photoelectric conversion efficiency of the solar cell, therefore, it is necessary to remove the metal impurities in the solar cell to optimize the photoelectric conversion efficiency of the solar cell. In some embodiments, the dopant element in the third doped parts 106 may be set to be the phosphorus element, and the third doped parts 106 doped with the phosphorus element has a greater solubility to the metal impurities, thereby providing phosphorus impurity absorption effect for the first doped parts 103, so as to reduce the content of the metal impurities in the first doped parts 103 and improve the photoelectric conversion efficiency of the solar cell.

For example, the dopant element in the substrate 100 may be the N-type dopant element, then the dopant element in the first doped parts 103 may be the N-type dopant element, and the second doped parts 104 and the third doped parts 106 are doped with the P-type dopant element. In some embodiments, the dopant element in the third doped parts 106 may be set to be boron element, and the third doped parts 106 doped with the boron element provides impurity absorption effect for the first doped parts 103, so as to reduce the content of the metal impurities in the first doped parts 103 and improve the photoelectric conversion efficiency of the solar cell.

In some embodiments, the type of the dopant element in the first doped parts 103 may be opposite to the type of the dopant element in the substrate 100, so that the first doped parts 103 and the substrate 100 form a PN junction. The type of the dopant element in the second doped parts 104 may be the same as the type of the dopant element in the substrate 100. The concentration of the dopant element in the second doped parts 104 is greater than the concentration of the dopant element in the substrate 100, and the type of the dopant element in the third doped parts 106 is opposite to the type of the dopant element in the first doped parts 103.

In some embodiments, in addition to the N-type dopant element or the P-type dopant element, the third doped parts 106 is doped with hydrogen elements, and the hydrogen elements in the third doped parts 106 can saturate a suspension bond in the first doped parts 103, thus providing the passivation effect for the first doped parts 103. The recombination of the carriers at the interface between the first doped parts 103 and the third doped parts 106 is reduced, which is conducive to the photoelectric conversion efficiency of the solar cell.

The first doped parts 103 may be made of amorphous silicon, polycrystalline silicon, silicon carbide or gallium arsenide (GaAs), etc. The second doped parts 104 may be made of amorphous silicon, polycrystalline silicon, silicon carbide or gallium arsenide (GaAs), etc.

The third doped parts 106 may be made of amorphous silicon, polycrystalline silicon, silicon carbide or gallium arsenide (GaAs), etc.

In some embodiments, the material of the third doped parts 106 may be the same as the material of the second doped parts 104, so that the third doped parts 106 and the second doped parts 104 may be prepared in the same process operation to simplify the process procedure. For example, after the first doped parts 103 is formed, an initial first doped layer may be formed, the initial first doped layer covers the multiple first doped parts 103 and the first surface 101 corresponding to multiple the second regions 2. At least a portion of the initial first doped layer on the first doped parts 103 is removed to expose a portion of the surface of the first doped parts 103. The remaining portion of the initial first doped layer on the first doped part 103 is taken as the third doped parts 106, and then the first electrodes 105 is formed on the top surface of the first doped part 103 exposed by the third doped parts 106. The initial first doped layer located in the second regions 2 is taken as the second doped parts 104.

In some embodiments, the material of the third doped parts 106 may also include silicon oxide or silicon nitride, such that the third doped parts 106 can be taken as a passivation layer, which, together with the second passivation layer 112, provides a passivation effect for the substrate 100.

In some embodiments, the third doped parts 106 and the second doped parts 104 may be prepared by a patterning process based on the same initial first doped layer. A thickness of a single third doped part is equal to a thickness of a single second doped part 104.

In some embodiments, the thickness of a single third doped part 106 may be less than the thickness of a single first doped part 103. In this case, the third doped parts 106 can provide an impurity absorption effect for the first doped parts 103, and the content of the dopant element in the third doped parts 106 with a less thickness is lower, it is beneficial to reduce the dopant element in the third doped parts 106 that diffuses to the first doped parts 103, so as to avoid affecting the performance of the first doped parts 103 after the dopant element in the third doped parts 106 is diffused to the first doped parts 103.

The thickness of a single third doped part 106 may range from 10 nm to 100 nm. For example, the thickness of the single third doped part may be 10 nm, 18 nm, 34 nm, 61 nm, 76.5 nm, 88 nm, 95 nm or 100 nm, so as to ensure that the third doped part has a good impurity absorption ability and avoid the excessive content of the dopant element in the third doped parts 106, to reduce the dopant element in the third doped parts 106 that diffuses to the first doped parts 103.

The thickness of a single first doped part may range from 50 nm to 140 nm. For example, the thickness of the single first doped may be 50 nm, 67 nm, 72 nm, 85 nm, 104 nm, 124 nm, 137 nm, or 140 nm.

In some embodiments, on the first doped part 103, the third doped part 106 may be located on one side of the first electrode 105 in the first direction. A ratio of a width of the third doped part 106 to a width of the first doped part 103 in the first direction ranges from 0.05 to 0.5. For example, the ratio may be 0.05, 0.14, 0.27, 0.35, 0.48, or 0.5. In a case that the ratio is in the above range, an area of the top surface of the first doped part 103 that is not covered by the third doped part 106 is larger, to reserve a large region for the first electrode 105 and to ensure that the first electrode 105 and the third doped part 106 on the first doped part 103 can be spaced apart from each other.

In the first direction, the width of the first doped part 103 may range from 150 μm to 1700 μm. For example, the width may be 150 μm, 437 μm, 798 μm, 926 μm, 1185 μm, 1372 μm, 1521 μm or 1700 μm.

In the first direction, the width of the third doped part 106 may range from 7.5 μm to 935 μm. For example, the width may be 7.5 μm, 75 μm, 188 μm, 385 μm, 593 μm, 735 μm, 858 μm, or 935 μm.

In some embodiments, on the first doped part 103, the third doped parts 106 may be located on two opposite sides of the first electrode 105 in the first direction. The area of the top surface of the first doped part 103 covered by the third doped parts 106 is greater than that in the case that, the third doped part 106 is located on one side of the first electrode 105 in the first direction on the first doped part 103. In this way, the impurity absorption effect of the third doped parts 106 on the first doped part 103 can be improved, and the photoelectric conversion efficiency of the solar cell can be improved. In addition, from the perspective of preparation process, the third doped parts 106 may be formed by performing the patterning process on the initial first doped layer covering the top surface of the first doped part 103. The case, that the third doped parts 106 on the first doped part 103 are located on two opposite sides of the first electrode 105 in the first direction, is helpful to reduce the area of an open film region of the initial first doped layer. In this way, the damage to the first doped part 103 on the bottom surface of the initial first doped layer can be reduced during the patterning process on the initial first doped layer, which is conducive to improving the performance of the solar cell.

In the first direction, a distance between the adjacent third doped parts 106 on each first doped part 103 is a first width, and a ratio of the first width to a width of the third doped part 106 in the first direction ranges from 0.23 to 68. For example, the ratio may be 0.23, 16, 36, 42, 57 or 68. In a case that the ratio is in the above range, the distance between the first electrode 105 and the third doped part 106 adjacent to the first electrode 105 is larger, and the area of the top surface of the first doped part 103 covered by the third doped parts 106 is larger, so as to achieve a better impurity absorption effect of the third doped parts 106 on the first doped part 103. From the perspective of the preparation process, the third doped parts 106 may be formed by performing the patterning process on the initial first doped layer covering the top surface of the first doped part 103. In a case that the ratio is in the above range, the area of the open film region of the initial first doped layer can be guaranteed not to be too large or too small, the time period of the preparation process of the solar cell is controlled to improve the production efficiency.

The first width may range from 135 μm to 510 μm. For example, the first width may be 135 μm, 142 μm, 272 μm, 351 μm, 378 μm, 425 μm, 491 μm, or 510 μm. In the first direction X, the width of the third doped part 106 may range from 7.5 μm to 595 μm. For example, the width may be 7.5 μm, 57 μm, 182 μm, 236 μm, 374 μm, 461 μm, 523 μm, or 595 μm.

Referring to FIG. 3, the solar cell may further include insulating layers 111 located between the third doped parts 106 and the first doped parts 103. The insulating layers 111 separates the third doped parts 106 from the first doped parts 103 and is capable of preventing the dopant element in the third doped parts 106 from entering the first doped parts 103, to avoid an adverse effect for the first doped parts 103 after the dopant element in the third doped parts 106 enters the first doped parts 103. For example, the adverse effect may be a case that the conductive type of the first doped parts 103 is changed, which may cause the solar cell to not operate properly.

The material of the insulating layers 111 may include silicon glass material doped with a first dopant element, a type of the first dopant element is the same as the type of the dopant element in the first doped parts 103. In this way, the insulating layer may be formed in the process for forming the first doped parts. For example, in the process for forming the first doped parts 103, an intrinsic semiconductor layer and a doping source layer may be formed successively, the doping source layer is doped with the first dopant element, the first dopant element in the doping source layer is propelled into the intrinsic semiconductor layer through a propulsion operation, the intrinsic semiconductor layer doped with the first dopant element is taken as the first doped parts 103. The remaining portion of the doping source layer is taken as the insulating layers 111. In this way, no additional operations are required to form the insulating layers 111, which can simplify the process operations for preparing the solar cell. In the operation of forming the third doped parts 106, the insulating layers 111 can prevent the dopant element in the third doped parts 106 from diffusing to the first doped parts 103.

In some embodiments, the insulating layer 111 may be made of at least one of silicon oxide, silicon oxynitride, aluminum oxide, titanium oxide, hafnium dioxide ($HfO_2$), gallium oxide ($Ga_2O_3$), silicon nitride, silicon carbonitride, aluminum nitride, titanium nitride, titanium carbonitride (TiCN) or silicon carbide (SiC). On the one hand, the insulating layers 111 made of these materials can separate the third doped parts 106 from the corresponding first doped parts 103, and on the other hand, the insulating layers 111 can achieve a passivation effect, which is conducive to improving the photoelectric conversion efficiency of the solar cell.

A gap 110 is arranged between the first doped part 103 and the second doped part 104 which are adjacent to each other, and a portion of the first surface 101 is exposed in the gap 110. That is, the gap 110 separates the first doped part 103 and the second doped part 104 which are adjacent to each other, thereby avoiding electric leakage caused by a tunnel junction formed between the first doped part 103 and the second doped part 104. In this way, the photoelectric conversion efficiency of the solar cell can be ensured. In some embodiments, the solar cell further includes a second passivation layer 112 which covers the first surface 101 exposed by the gap 110.

In the first direction, the width of the gap 110 may range from 100 μm to 765 μm. For example, the width may be 100 μm, 165 μm, 310 μm, 455 μm, 582 μm, 637 μm, 705 μm, or 765 μm.

In some embodiments, the substrate is provided with a textured structure on the first surface 101 exposed at the gap 110, which is conducive to increasing the internal reflection of the incident light by the first surface 101 exposed by the gap 110, thereby improving an absorption utilization rate of the incident light on the substrate 100, and thus improving the photoelectric conversion efficiency of the solar cell. In some embodiments, the first surface 101 exposed at the gap 110 may also be a polished surface, so that a flatness of the first surface 101 is increased, the reflection of long-wave light is increased, secondary absorption of the incident light is promoted, thereby improving short circuit current Isc. In addition, the relatively flat first surface 101 helps to reduce the defects in the second passivation layer formed on the first surface 101.

In some embodiments, the solar cell may further include a dielectric layer located on the first surface. The dielectric layer is located between the multiple first doped parts and the first surface and between multiple second doped parts and the first surface, and the dielectric layer covers the first surface exposed at the gap. Alternatively, the dielectric layer is only located between the multiple first doped parts and the first surface and between multiple second doped parts and the first surface.

Figure 5:
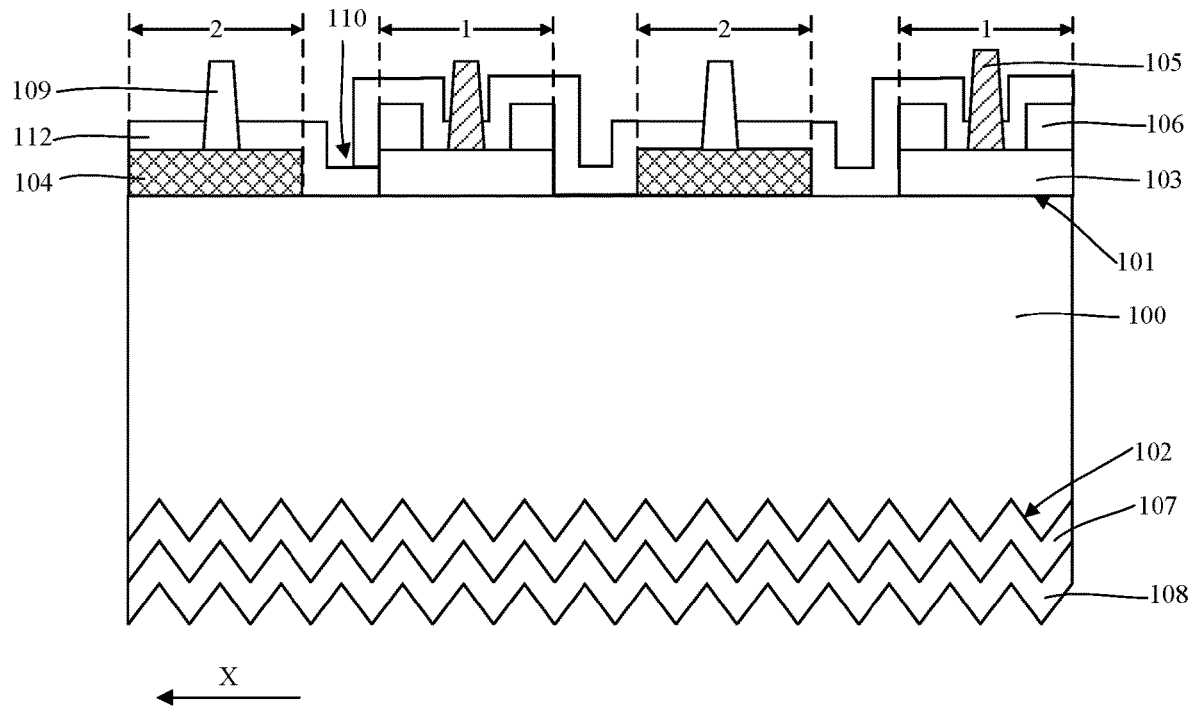
FIG. 5 is a schematic structural diagram of a fourth type of solar cell according to an embodiment of the present disclosure.

FIG. 5 is a schematic structural diagram of a fourth type of solar cell according to an embodiment of the present disclosure.

Referring to FIG. 5, in a thickness direction of the substrate 100, the first surface 101 corresponding to the first regions 1 is level with the first surface 101 corresponding to the second regions 2. The gap 110 is arranged between the first doped part 103 and the second doped part 104 which are adjacent to each other.

Referring to FIG. 1, in the thickness direction of the substrate 100, the first surface 101 corresponding to the first regions 1 is not level with the first surface 101 corresponding to the second regions 2, a distance between the first surface 101 corresponding to the first regions 1 and the second surface 102 is a first height, a distance between the first surface 101 corresponding to the second regions 2 and the second surface 102 is a second height, and the first height is greater than the second height. The gap 110 is arranged between the first doped part 103 and the second doped part 104 which are adjacent to each other.

Figure 6:
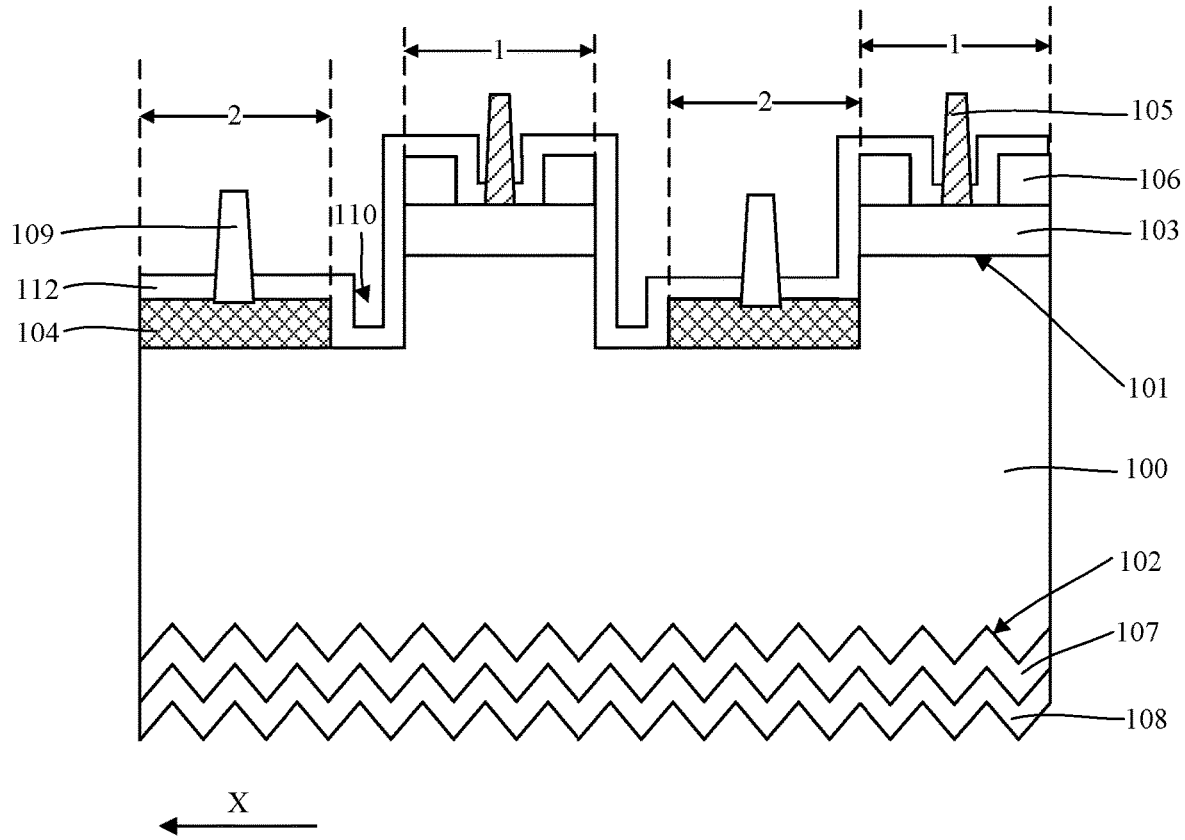
FIG. 6 is a schematic structural diagram of a fifth type of solar cell according to an embodiment of the present disclosure.

FIG. 6 is a schematic structural diagram of a fifth type of solar cell according to an embodiment of the present disclosure.

Referring to FIG. 6, in a thickness direction of the substrate 100, the first surface 101 corresponding to the first regions 1 is not level with the first surface 101 corresponding to the second regions 2, a distance between the first surface 101 corresponding to the first regions 1 and the second surface 102 is a first height, a distance between the first surface 101 corresponding to the second regions 2 and the second surface 102 is a second height, and the first height is greater than the second height. The gap 110 is arranged between at least a portion of the first doped parts 103 and the second doped parts 104 which are adjacent to each other. Compared with the case that the gap 110 is arranged between all of the first doped parts 103 and the second doped parts 104 which are adjacent to each other, this case is conducive to reducing the size of the multiple gaps 110 in the direction parallel to the first surface 101, and thus to increasing the size of the first doped parts 103 and the second doped parts 104 in the first direction within a limited size range.

The adjacent first and second doped parts are taken as one unit, the number of gaps in the solar cell provided in the embodiment of the present disclosure may be a first value. A ratio of the first value to the number of the units may be greater than 0 and less than 0.8.

Figure 7:
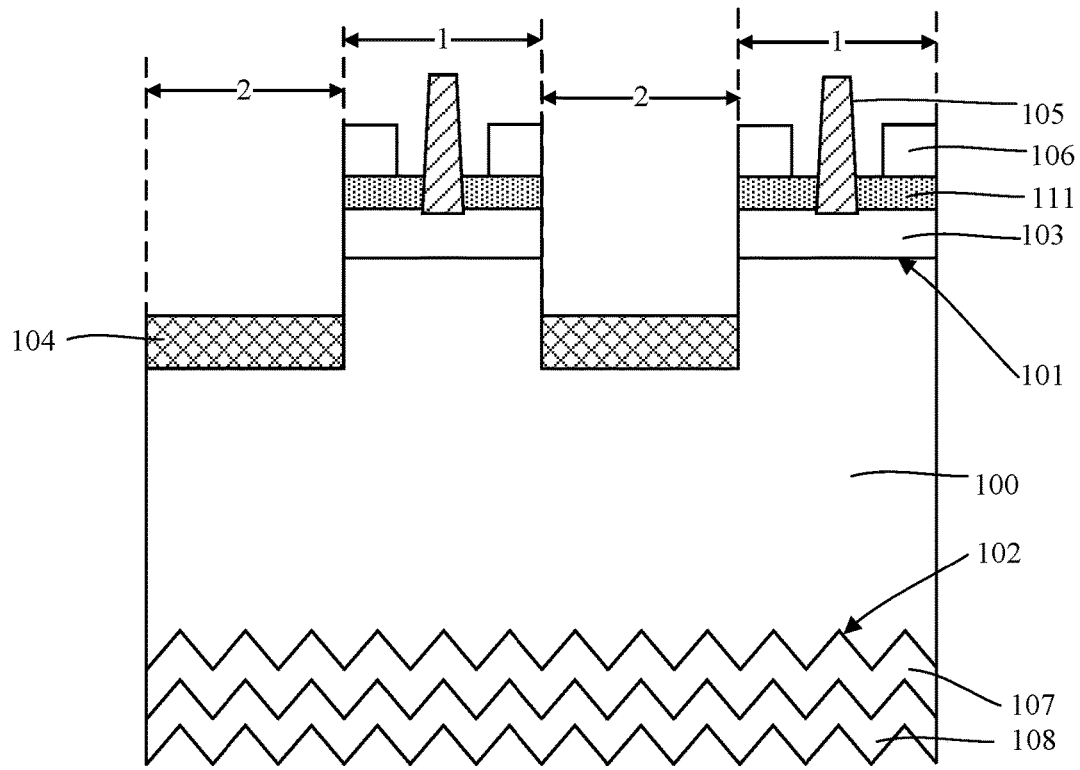
FIG. 7 is a schematic structural diagram of a sixth type of solar cell according to an embodiment of the present disclosure.

FIG. 7 is a schematic structural diagram of a sixth type of solar cell according to an embodiment of the present disclosure Referring to FIG. 7, in some embodiments, there are no gaps between the first doped part 103 and the second doped part 104 which are adjacent to each other. Since the first height is greater than the second height, the first doped part 103 and the second doped part 104, which are adjacent to each other, are spaced apart in the thickness direction of the substrate 100 due to the height difference. In this way, it is beneficial to increase the density of the first doped parts and the second doped parts in the solar cell.

Accordingly, another embodiment of the present disclosure provides a method for manufacturing a solar cell, and the solar cell according to the above embodiments may be made by the method for manufacturing the solar cell according to the embodiment of the present disclosure. The method for manufacturing the solar cell according to the embodiment of the present disclosure will be described in detail in the following paragraphs combined with the drawings. For the parts identical or corresponding to the above embodiments, reference may be made to the corresponding descriptions of the above embodiments, which will not be detailed in the following paragraphs.

FIG. 8 to FIG. 14 are schematic structural diagrams corresponding to operations of the method for manufacturing the solar cell according to an embodiment of the present disclosure. FIG. 15 to FIG. 20 are schematic structural diagrams corresponding to operations of the method for manufacturing the solar cell according to another embodiment of the present disclosure.

Figure 8:
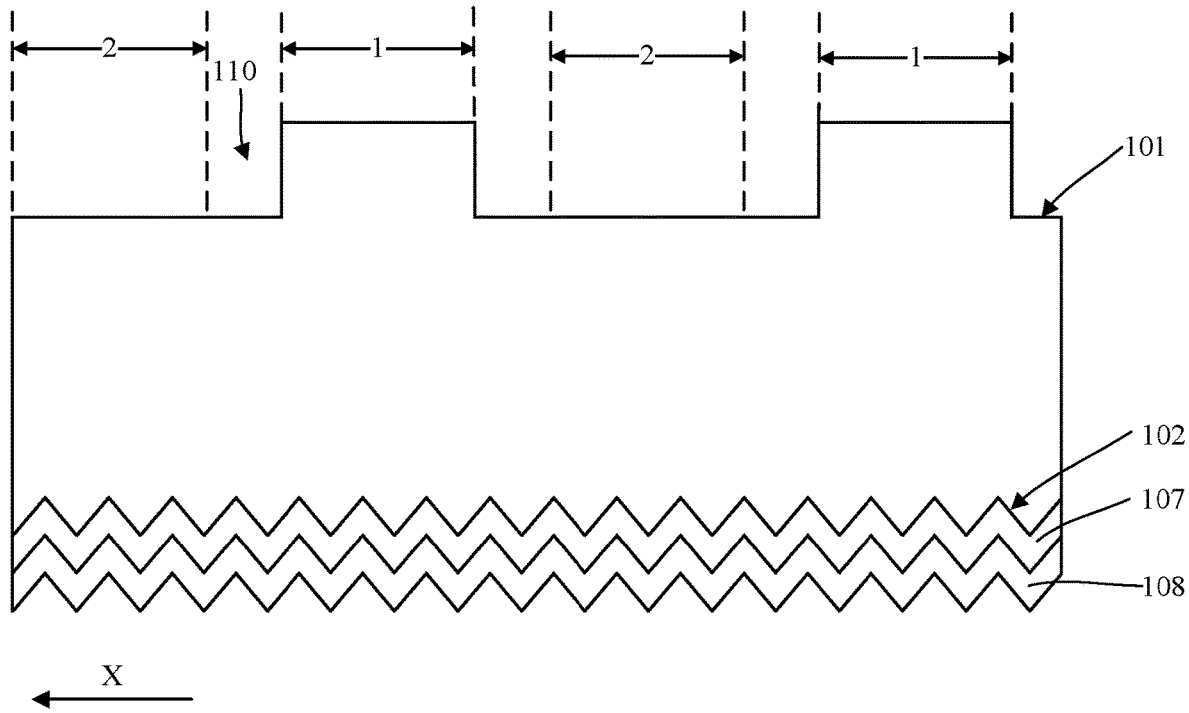
FIG. 8 is a schematic structural diagram corresponding to an operation for providing a substrate in a method for manufacturing a solar cell according to an embodiment of the present disclosure.
Figure 15:
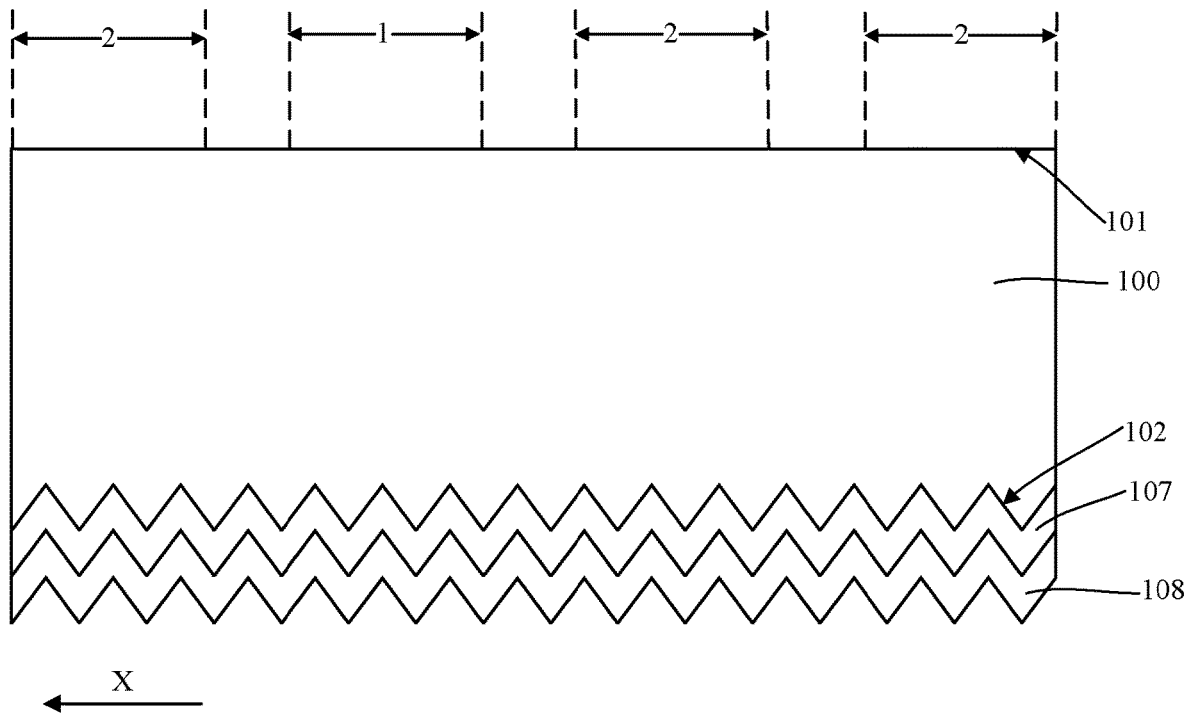
FIG. 15 is a schematic structural diagram corresponding to an operation for providing a substrate in a method for manufacturing a solar cell according to a further embodiment of the present disclosure.

FIG. 8 is a schematic structural diagram corresponding to an operation for providing a substrate in a method for manufacturing a solar cell according to an embodiment of the present disclosure. FIG. 15 is a schematic structural diagram corresponding to an operation for providing a substrate in a method for manufacturing a solar cell according to another embodiment of the present disclosure.

Referring to FIG. 8, a substrate 100 is provided. The substrate 100 has a first surface 101 and a second surface 102 which are opposite to each other. The first surface 101 includes first regions 1 and second regions 2 arranged alternatingly in a first direction X. In FIG. 8, a gap 110 is arranged between the first region and the second region which are adjacent to each other in the substrate, and the first surface corresponding to the first regions is higher than the first surface corresponding to the second regions. The gap is arranged between the adjacent first and second regions in the first direction X. The region for separating the adjacent first and second regions is taken as the gap.

In some embodiments, there are no gaps between the adjacent first and second regions.

Referring to FIG. 15, in some embodiments, the first surface corresponding to the first regions is level with the first surface corresponding to the second regions, the gap 110 is arranged between the first region and the second region which are adjacent to each other.

The material of the substrate 100 may refer to the above embodiments and is not detailed below. The substrate 100 may be doped with an N-type dopant element or a P-type dopant element. The N-type dopant element may be any one of group-V elements such as phosphorus element, bismuth element, antimony element or arsenic element. The P-type dopant element may be any one of group-III elements such as boron element, aluminum element, gallium element or indium element.

In some embodiments, a texturing processing may be performed on the second surface 102 of the substrate 100 to make the second surface 102 have a textured structure. In some embodiments, the textured structure may be prepared by a solution texturing method. The textured structure can increase the number of refraction times of light on the surface of the solar cell, which is conducive to the absorption of light by the solar cell, so as to achieve the maximum utilization rate of the solar energy on the solar cell. For example, the substrate 100 may be monocrystalline silicon, the texturing processing may be performed on the surface of the substrate 100 through a mixed solution of an alkali solution and an alcohol solution. The substrate 100 may be polycrystalline silicon, the texturing processing may be performed on the surface of the substrate 100 through an acid solution. In some embodiments, the textured structure may be prepared by a laser texturing processing or a reactive ion etching (RIE) texturing process.

In some embodiments, the texturing processing may also be performed on the first surface 101 of the substrate 100 in the operation of performing the texturing processing on the second surface 102 of the substrate 100. In some embodiments, a polishing process is performed on the first surface 101 of the substrate 100 to make the first surface 101 be a polished surface. The polished surface is conducive to reducing the defects in the film layer subsequently formed on the first surface 101.

A front surface field 107 may be formed on the second surface 102 of the substrate 100, and the concentration of the dopant element in the front surface field is greater than the concentration of the dopant element in the substrate 100, so that the field passivation effect can be used to reduce the concentration of minority carriers on the surface, thus reducing the surface recombination rate, while reducing the series resistance and improving the electron transport ability.

In some embodiments, after the front surface field 107 is formed, a first passivation layer 108 may be formed on a surface of the front surface field away from the substrate 100. The first passivation layer provides a passivation effect for the second surface 102 of the substrate 100. The process for forming the first passivation layer may include an atomic layer deposition process or a Plasma Enhanced Chemical Vapor Deposition (PECVD) process.

Figure 11:
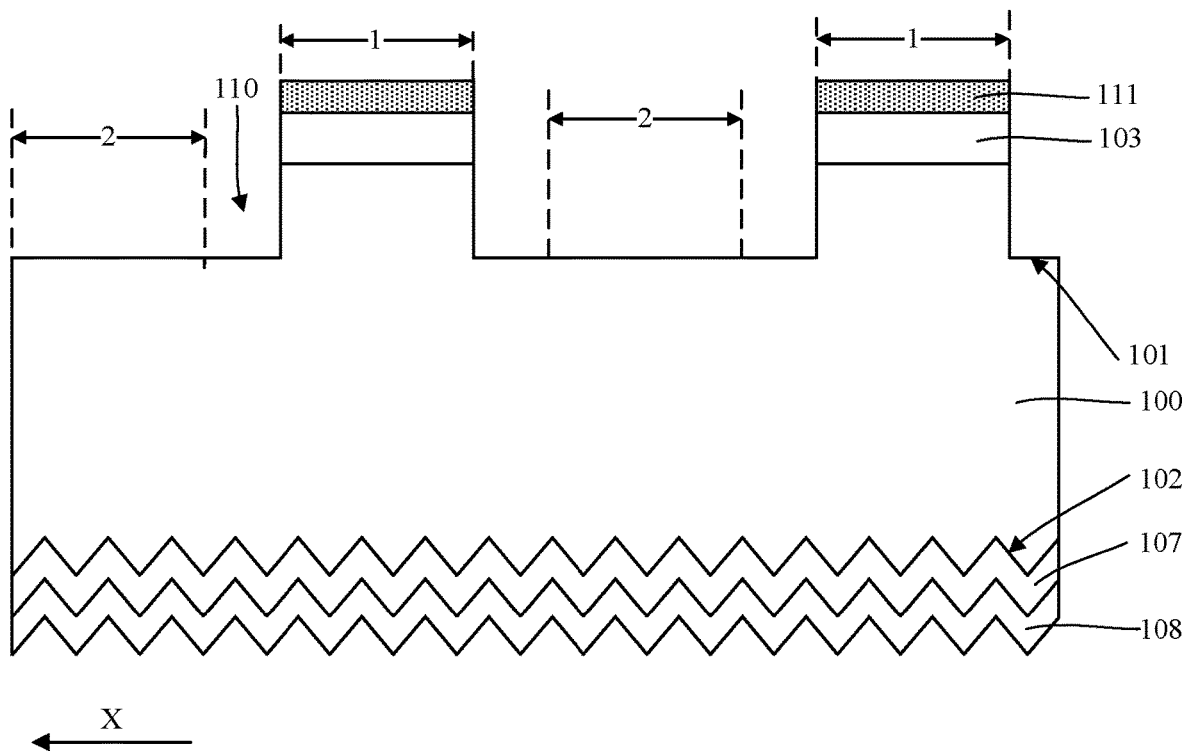
FIG. 11 is a schematic structural diagram corresponding to an operation for providing a substrate in a method for manufacturing a solar cell according to another embodiment of the present disclosure.

FIG. 11 is a schematic structural diagram corresponding to an operation for providing a substrate in a method for manufacturing a solar cell according to an embodiment of the present disclosure.

Referring to FIG. 11, multiple first doped parts 103 are formed. A respective first doped part of the multiple first doped parts 103 is located on a corresponding first region of the first regions 1. A top surface of the respective first doped part 103 includes a metal region.

The metal region extends in a second direction. The second direction intersects the first direction X, and is parallel to the top surface of the first doped part 103. It should be noted that a first electrode is formed on the top surface of the first doped part in subsequent operations. An orthographic projection of the first electrode on the top surface of the corresponding first doped part is located in the metal region. That is, the metal region is a portion of the top surface of the first doped part in contact with the first electrode. In the first direction X, a width of the metal region may be greater than a width of the first electrode.

The first doped part 103 is doped with an N-type dopant element or a P-type dopant element. The type of the dopant element in the first doped part 103 is the same as or different from the type of the dopant element in the substrate 100.

Figure 9:
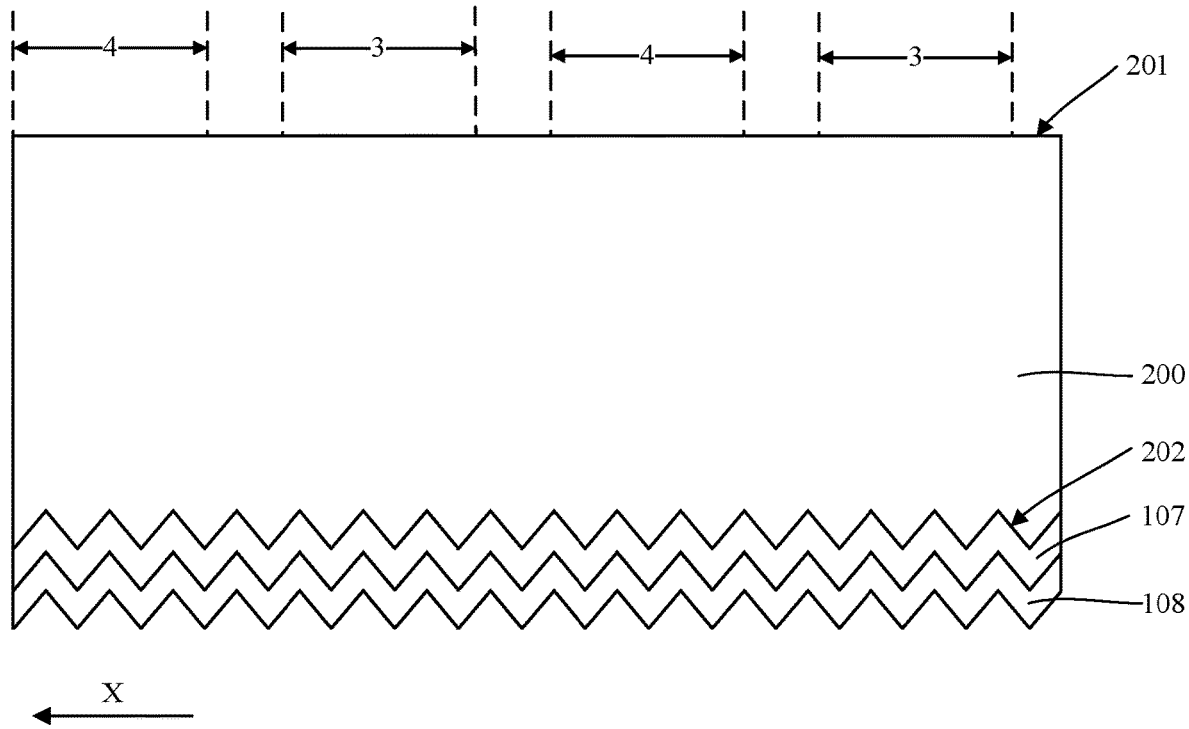
FIG. 9 is a schematic structural diagram corresponding to an operation for providing an initial substrate in a method for manufacturing a solar cell according to an embodiment of the present disclosure.
Figure 10:
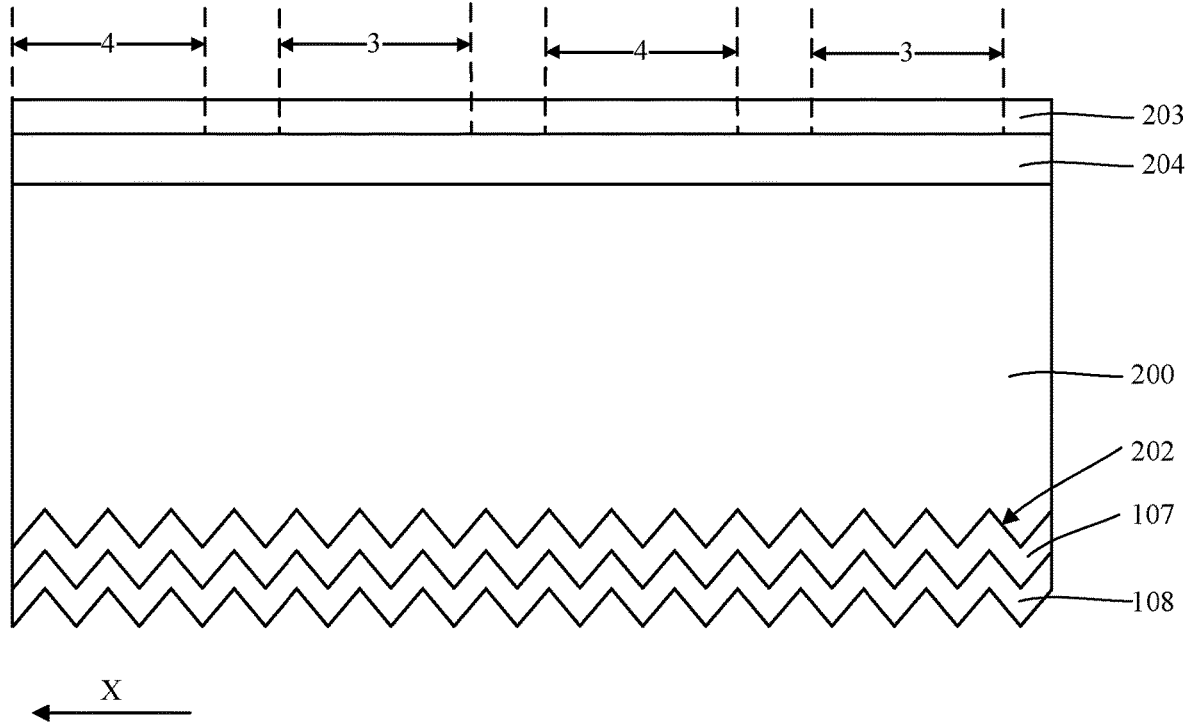
FIG. 10 is a schematic structural diagram corresponding to an operation for forming a doping source layer in a method for manufacturing a solar cell according to an embodiment of the present disclosure.

FIG. 9 is a schematic structural diagram corresponding to an operation for providing an initial substrate in a method for manufacturing a solar cell according to an embodiment of the present disclosure. FIG. 10 is a schematic structural diagram corresponding to an operation for forming a doping source layer in a method for manufacturing a solar cell according to an embodiment of the present disclosure.

Referring to FIG. 9 to FIG. 11, the operation for forming the first doped parts 103 may include: forming an initial substrate 200 having a third surface 201 and a fourth surface 202 which are opposite to each other, where the third surface 201 includes third regions 3 and fourth regions 4 arranged alternatingly in the first direction; forming a doping source layer 203 covering the third regions 3 and the fourth regions 4, where the doping source layer 203 has target dopant elements; performing a propulsion operation to propel the target dopant elements in the doping source layer 203 to the initial substrate 200 to form an initial second doped layer 204; and removing the doping source layer 203 and the initial second doped layer 204 on the fourth regions, removing a portion of a thickness of the initial substrate 200 corresponding to the fourth regions 4, taking a remaining portion of the initial substrate 200 as the substrate 100, taking a remaining portion of the initial second doped layer 204 on the third regions 3 as the first doped parts 103, and taking a remaining portion of the doping source layer on the third regions 3 as an insulating layer 111.

A portion of the thickness of the initial substrate 200 corresponding to the fourth regions 4 is removed, the second doped parts may be formed on the second regions 2 (that is, the fourth regions) in the subsequent operation, in this way, a height difference between the first doped parts 103 and the second doped parts formed in the subsequent operation is formed in the thickness direction of the substrate 100. Therefore, the first doped parts 103 and the second doped parts are spaced apart in the thickness direction of the substrate 100, so as to avoid electric leakage caused by a tunnel junction between the first doped parts 103 and the second doped parts 104, and to ensure that the photoelectric conversion efficiency of the solar cell is high. The first surface 101 corresponding to the first regions 1 is level with the first surface 101 corresponding to the second regions 2. In addition, no additional operations are required to form the insulating layer, which can simplify the process operations for preparing the solar cell.

It should be noted that, in the above operation for forming the first doped parts 103, after removing the doping source layer 203 and the initial second doped layer 204 on the fourth regions and removing a portion of the thickness of the initial substrate 200 corresponding to the fourth regions 4, the initial substrate 200 is taken as the substrate 100, the third regions 3 is taken as the first regions 1 of the substrate 100, a surface of the initial substrate 200 corresponding to the fourth regions, which is adjacent to the initial second doped layer, is taken as the first surface 101 corresponding to the second regions 2. Before preparing the first doped parts, the front surface field 107 and the first passivation layer 108 may be formed on the fourth regions.

The target doping element may be an N-type dopant element or a P-type dopant element. The doping source layer 203 may be a silica glass material layer doped with N-type dopant elements or P-type dopant elements. Correspondingly, the insulating layer 111 is a silica glass material layer doped with N-type dopant elements or P-type dopant elements. In the subsequent operation of forming the third doped parts on the top surface of the first doped parts 103, the insulating layer 111 can act as a barrier to prevent excessive dopant elements in the third doped parts from diffusing to the first doped parts 103, so as to ensure good performance of the first doped parts 103. For example, the first doped parts 103 may be doped with the P-type dopant element boron, then the doping source layer may be a borosilicate glass layer, correspondingly, the insulating layer is the borosilicate glass layer. For example, the first doped parts 103 may be doped with the N-type dopant element phosphorus, then the doping source layer may be a phosphorosilicate glass layer, correspondingly, the insulating layer is the phosphorosilicate glass layer.

In some embodiments, a gap region is arranged between adjacent fourth and third regions. In the operation of forming the doping source layer 203, the doping source layer 203 is located on the third surface corresponding to the gap regions. In the propulsion operation, a portion of the initial substrate corresponding to the gap regions is converted to the initial second doped layer 204. In the operation of forming the first doped parts 103, the doping source layer and the initial second doped layer corresponding to the gap regions are removed.

Figure 16:
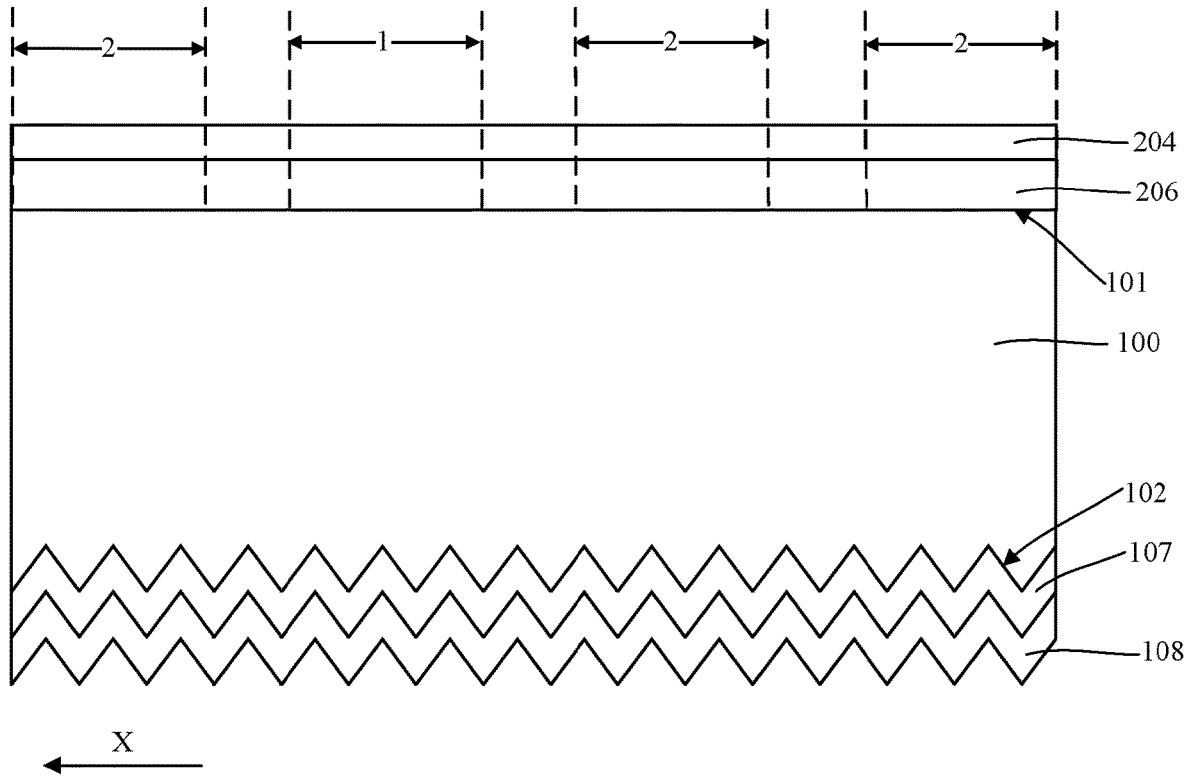
FIG. 16 is a schematic structural diagram corresponding to an operation for forming an intrinsic semiconductor layer in a method for manufacturing a solar cell according to an embodiment of the present disclosure.
Figure 17:
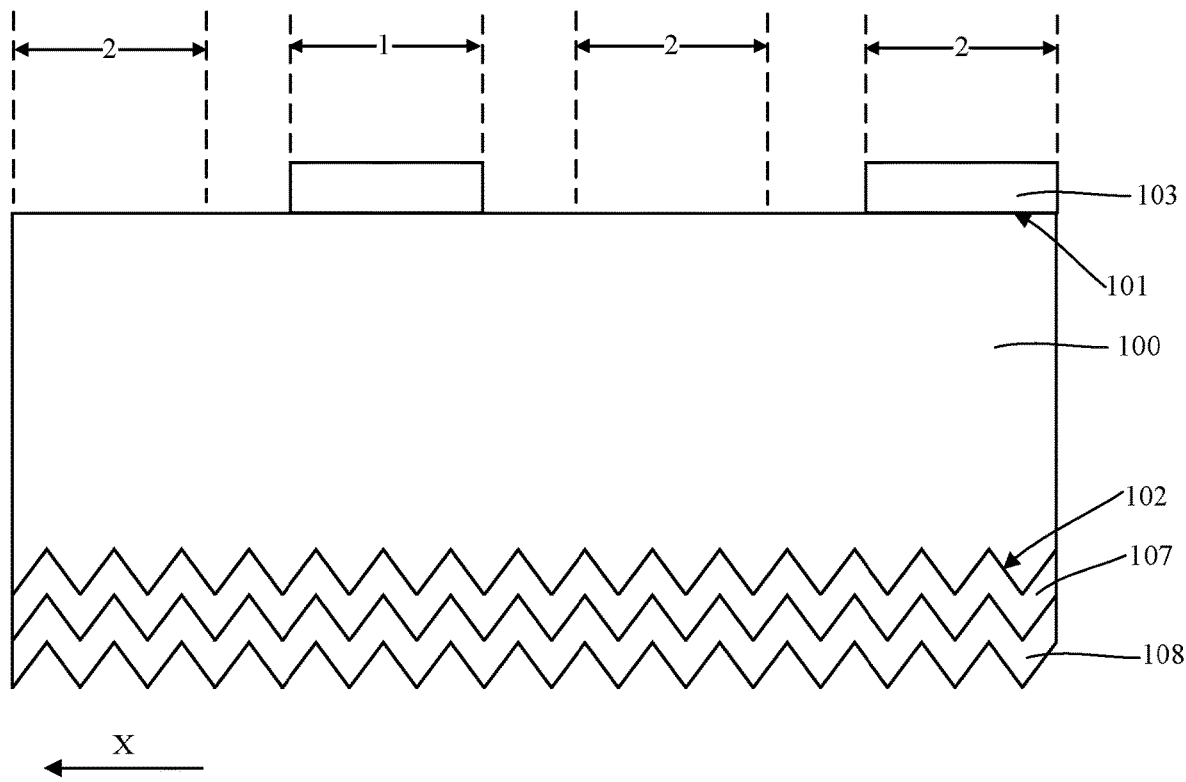
FIG. 17 is a schematic structural diagram corresponding to an operation for providing a substrate in a method for manufacturing a solar cell according to yet another embodiment of the present disclosure.

FIG. 16 is a schematic structural diagram corresponding to an operation for forming an intrinsic semiconductor layer in a method for manufacturing a solar cell according to an embodiment of the present disclosure, and FIG. 17 is a schematic structural diagram corresponding to an operation for providing a substrate in a method for manufacturing a solar cell according to an embodiment of the present disclosure.

Referring to FIG. 15, in some embodiments, the first surface corresponding to the first regions is level with the first surface corresponding to the second regions, the gap 110 is arranged between the adjacent first and second regions. Referring to FIG. 16 to FIG. 17, the operation for forming the first doped parts 103 may include: forming an intrinsic semiconductor layer 206 on the substrate 100, where the intrinsic semiconductor layer covers first regions 1, second regions 2 and the gap regions 110; forming a doping source layer 203 on the intrinsic semiconductor layer, where the doping source layer 203 has the target dopant elements; performing a propulsion operation to propel the target dopant elements in the doping source layer 203 into the intrinsic semiconductor layer 206, to form the initial second doped layer 204; and removing a portion of the initial second doped layer 204 on the second regions 2 and the gap regions 110 and removing the doping source layer, and taking a remaining portion of the initial second doped layer 204 on the first regions 1 as the first doped parts 103.

In the operation of forming the first doped parts 103, there is no need to remove a portion of the thickness of the substrate 100, the first surface 101 corresponding to the first regions 1 is level with the first surface 101 corresponding to the second regions 2. The bottom surface of the second doped parts subsequently formed on the second regions 2 is level with the bottom surface of the first doped parts 103. It is necessary to remove a portion of the first doped parts 103 or a portion of the second doped parts through a laser processing to separate the first doped part 103 and the second doped part which are adjacent to each other, to avoid electric leakage between the first doped part 103 and the second doped part which are adjacent to each other.

It should be noted that, the above method for forming the first doped parts 103 is only an example, and the method for forming the first doped parts 103 is not specifically limited in the embodiment of the present disclosure.

In some embodiments, the doping source layer 203 may be removed after the first doped parts 103 is formed and before the second doped parts and third doped parts are formed. The subsequently formed third doped parts are in direct contact with the top surface of the corresponding first doped parts 103.

In some embodiments, the doping source layer may be removed after the first doped part 103 is formed and before the second doped part and third doped part are formed. That is, the doping source layer 203 on the top surface of the first doped parts 103 is not retained as the insulating layer, the insulating layer is formed on the top surface of the first doped parts 103. The material of the insulating layer may include at least one of silicon oxide, silicon oxynitride, aluminum oxide, titanium oxide, hafnium dioxide, gallium oxide, silicon nitride, silicon carbonitride, aluminum nitride, titanium nitride, titanium carbonitride or silicon carbide. On the one hand, the insulating layer 111 made of these materials can separate the subsequently formed third doped parts 106 from the corresponding first doped parts 103, and on the other hand, the insulating layer 111 can achieve a passivation effect, which is conducive to improving the photoelectric conversion efficiency of the solar cell.

Figure 12:
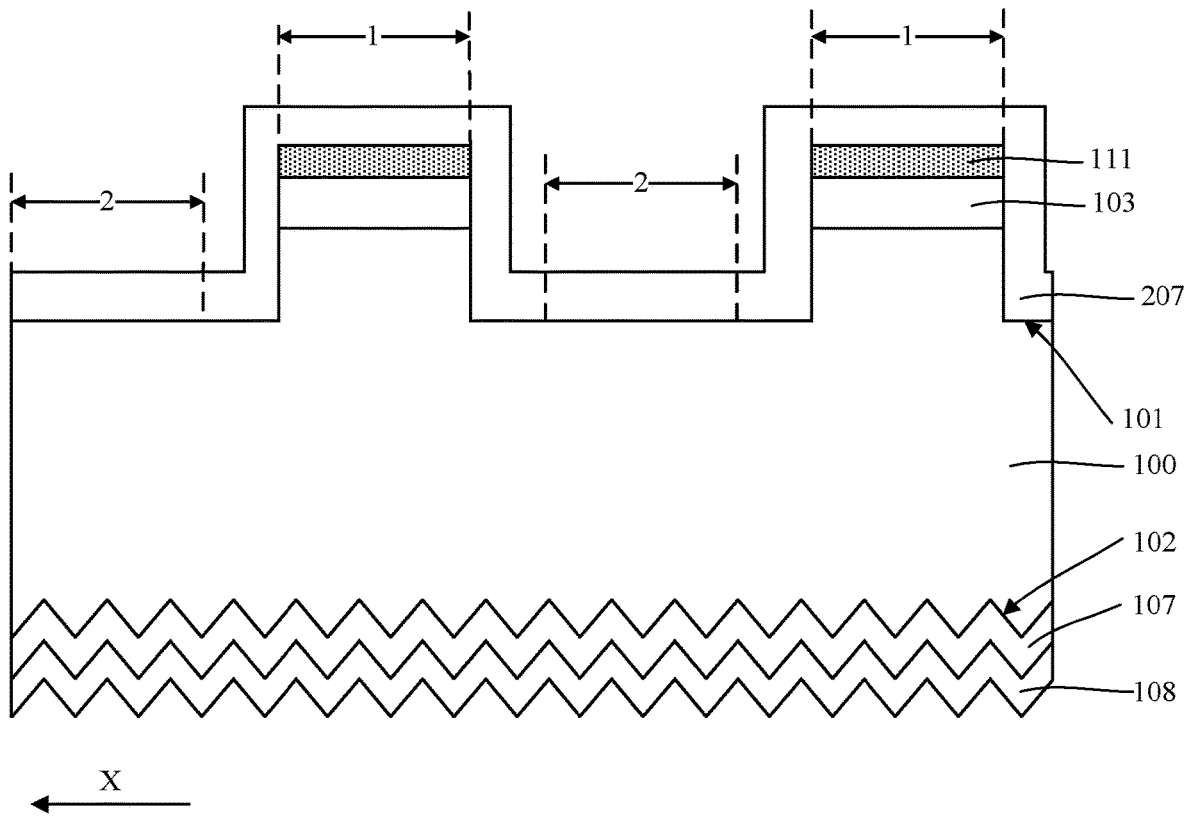
FIG. 12 is a schematic structural diagram corresponding to an operation for forming an initial first doped layer in a method for manufacturing a solar cell according to an embodiment of the present disclosure.
Figure 18:
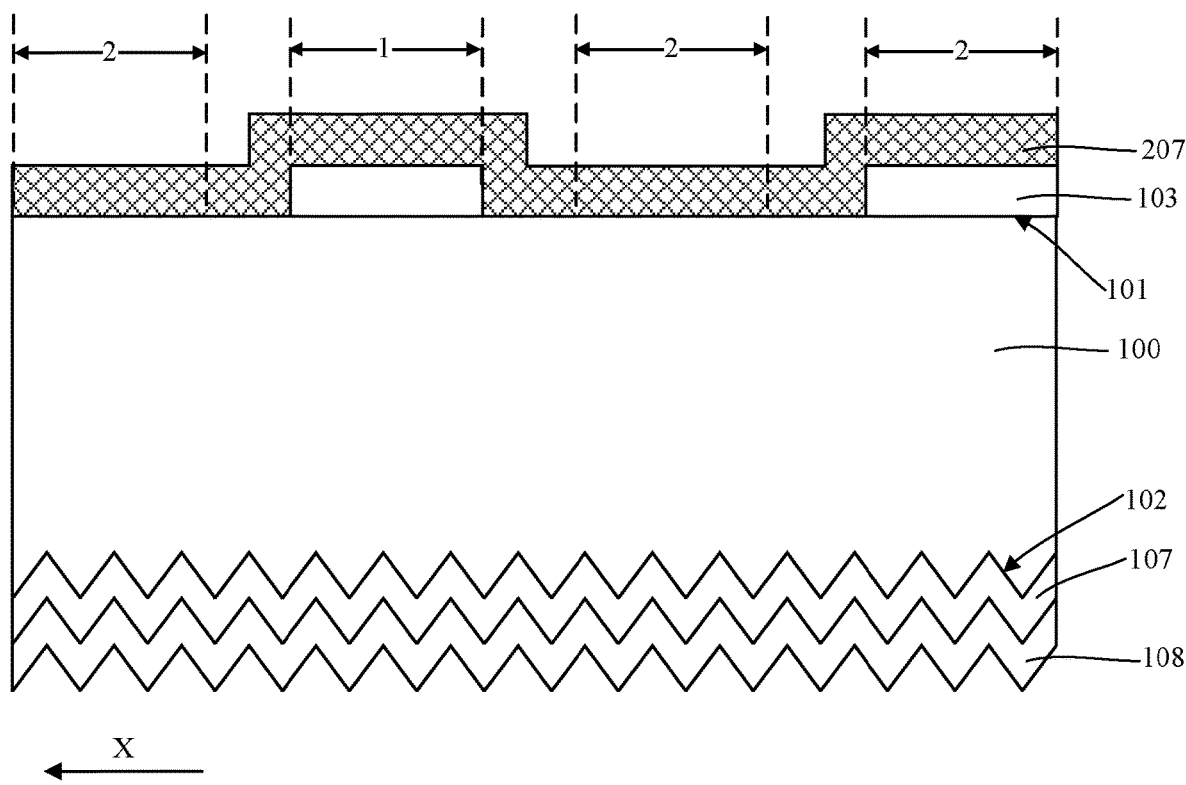
FIG. 18 is a schematic structural diagram corresponding to an operation for forming an initial first doped layer in a method for manufacturing a solar cell according to an embodiment of the present disclosure.

FIG. 12 is a schematic structural diagram corresponding to an operation for forming an initial first doped layer in a method for manufacturing a solar cell according to an embodiment of the present disclosure, and FIG. 18 is a schematic structural diagram corresponding to an operation for forming an initial first doped layer in a method for manufacturing a solar cell according to another embodiment of the present disclosure.

Referring to FIG. 12 and FIG. 18, an initial first doped layer 207 is formed. The initial first doped layer 207 covers the multiple first doped parts 103 and the first surface 101 corresponding to multiple the second regions 2. A type of a dopant element in the initial first doped layer 207 is different from a type of a dopant element in the first doped parts 103. The initial first doped layer 207 covers the insulating layer 111 on the first doped parts 103. The initial first doped layer is used to prepare the second and third doped parts through the patterning process.

In some embodiments, the first doped parts 103 are doped with P-type dopant elements, then the initial first doped layer 207 may be doped with N-type dopant elements. In some embodiments, the first doped parts 103 are doped with the N-type dopant elements, then the initial first doped layer 207 may be doped with the P-type dopant elements.

Referring to FIG. 12, in some embodiments, there may be a gap 110 between the first region 1 and the second region 2 which are adjacent to each other. In the operation of forming the initial first doped layer, the initial first doped layer is located on the gap 110.

In some embodiments, there are no gaps between the first region 1 and the second region 2 which are adjacent to each other. The first region 1 and the second region 2, which are adjacent to each other, are connected. If the first surface 101 corresponding to the first regions 1 is higher than the first surface 101 corresponding to the second regions 2, after the patterning process is performed on the initial first doped layer 207 through the laser processing in subsequent operations, the remaining portion of the initial first doped layer 207 on the second regions 2 is separated from the first doped parts 103 in the thickness direction of the substrate 100. If the first surface 101 corresponding to the first regions 1 is level with the first surface 101 corresponding to the second regions 2, a portion of the initial first doped layer 207, located on two opposite side walls of the first doped part 103 in the first direction, is subsequently removed by a laser process to separate the first doped part 103 from the initial first doped layer 207 on the adjacent second region 2.

In some embodiments, the first surface 101 corresponding to the first regions 1 is higher than the first surface 101 corresponding to the second regions 2, there may be a gap between a portion of the first regions and the second regions which are adjacent, and the initial first doped layer is located on the gap 110. The initial first doped layer 207 located on the gap is subsequently removed by a laser processing.

Figure 13:
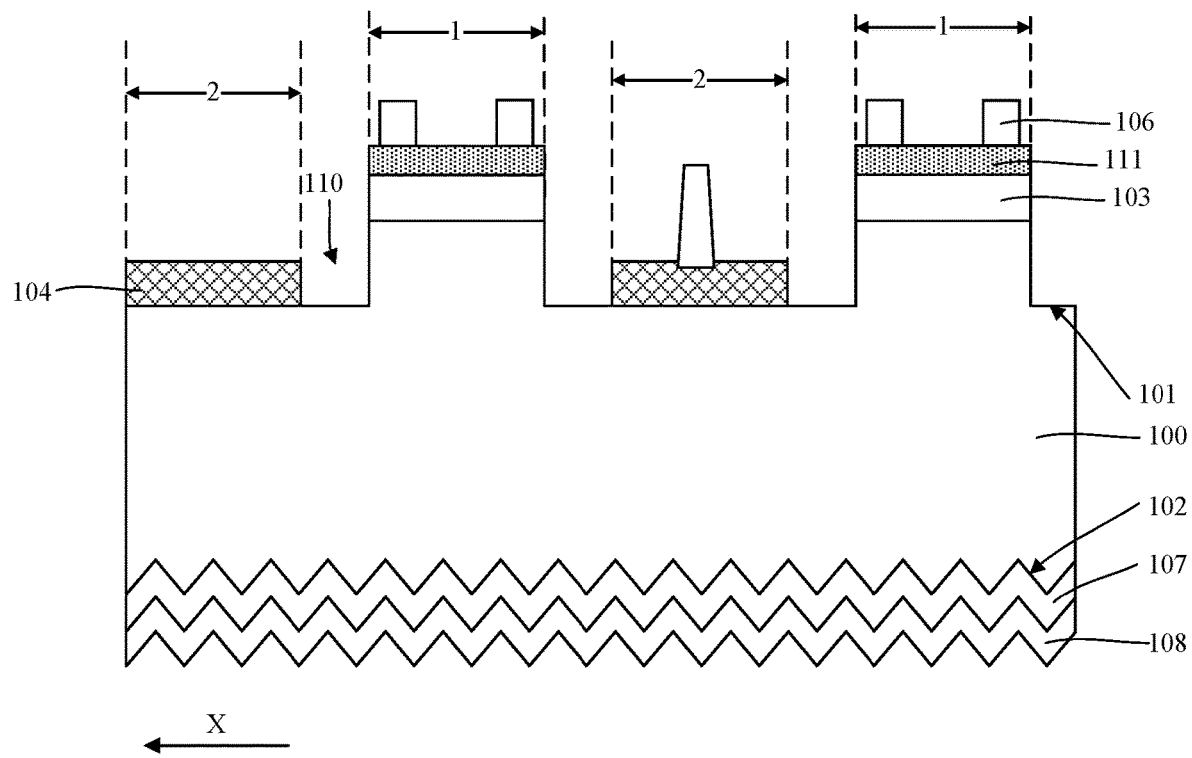
FIG. 13 is a schematic structural diagram corresponding to an operation for forming a second doped part and a third doped part in a method for manufacturing a solar cell according to an embodiment of the present disclosure.
Figure 19:
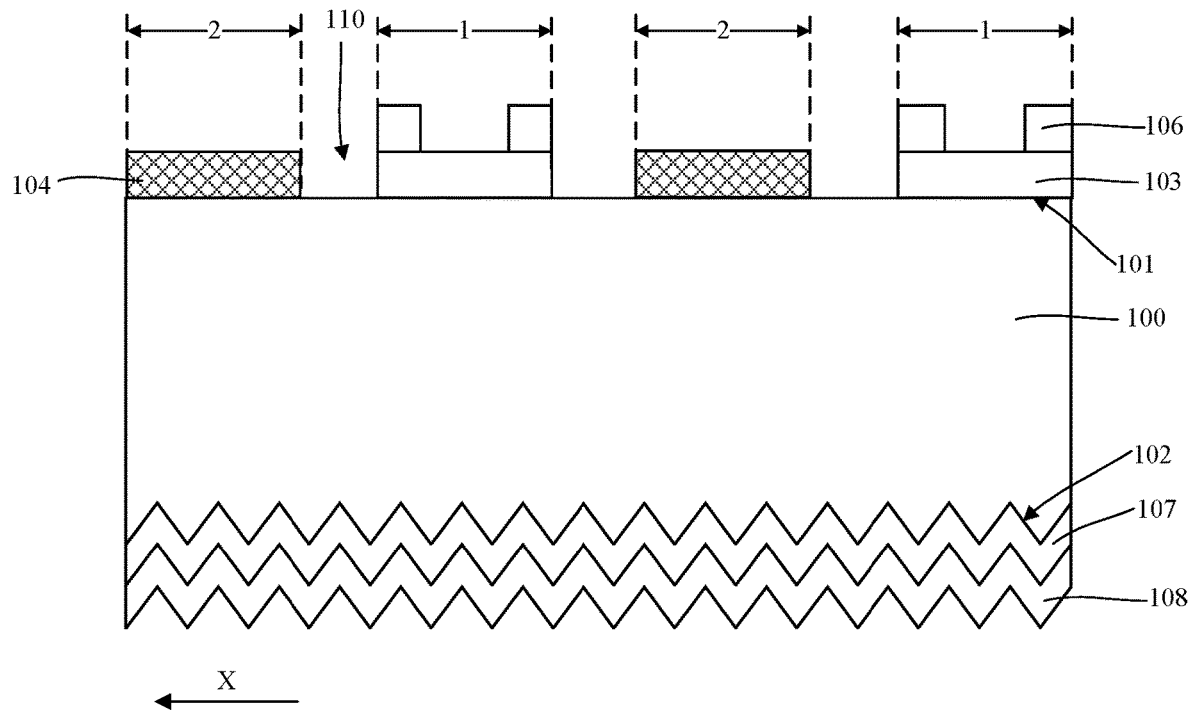
FIG. 19 is a schematic structural diagram corresponding to an operation for forming a second doped part and a third doped part in a method for manufacturing a solar cell according to an embodiment of the present disclosure.

FIG. 13 is a schematic structural diagram corresponding to an operation for forming a second doped part and a third doped part in a method for manufacturing a solar cell according to an embodiment of the present disclosure, and FIG. 19 is a schematic structural diagram corresponding to an operation for forming a second doped part and a third doped part in a method for manufacturing a solar cell according to another embodiment of the present disclosure.

Referring to FIG. 13 and FIG. 19, at least a portion of the initial first doped layer 207 on the metal region is removed by a laser processing, to expose the metal region. A remaining portion of the initial first doped layer 207 on the second region 2 is taken as a second doped part 104. A remaining portion of the initial first doped layer on the first doped part 103 is taken as a third doped part 106. In this way, it is not necessary to remove all the initial first doped layer 207 on the first doped part 103, which is conducive to reducing the area of the open film region of the initial first doped layer 207, thereby reducing the process cost and improving the process efficiency. In addition, the third doped part 106 and the first doped part 103 are formed in the same process, and no additional operations are required to form the third doped part 106, which is beneficial to control the process cost.

In some embodiments, gaps 110 are arranged between at least a portion of the first regions 1 and the second regions 2 which are adjacent to each other. The initial first doped layer covers the first surface 101 exposed at the gaps 110. In the operation of removing at least the initial first doped layer on the metal region by the laser processing, the initial first doped layer on the gaps is removed.

In some embodiments, in the operation of removing at least the initial first doped layer on the metal region by the laser processing, in addition to removing the initial first doped layer on the gaps, the portion of the initial first doped layer at the second region 2, which is adjacent to the first region 1, may further be removed to increase the process window of the laser processing and reduce the process difficulty.

Referring to FIG. 11, in the above embodiments, the doping source layer 203 located on the regions 1 in the operation of forming the first doped parts 103 is retained as the insulating layer 111. In the operation of removing at least a portion of the initial first doped layer on the metal region by the laser processing, the doping source layer on the metal region is removed and the doping source layer on a region other than the metal region in the third regions (i.e., the first region 1) is taken as the insulating layer 111.

In some embodiments, the doping source layer on the regions 1 may be removed during the operation of forming the first doped parts 103, so that there is no need to remove the insulating layer 111 in the laser processing. The formed third doped parts are directly in contact with the first doped parts 103, the type of the dopant element in the third doped parts is different from the type of the dopant element in the first doped parts 103. The third doped parts can provide an impurity absorption effect for the first doped parts 103 to reduce the content of metal impurities in the first doped parts 103, which is conducive to improving the photoelectric conversion efficiency of the formed solar cell.

In some embodiments, after removing at least a portion of the initial first doped layer on the metal region by the laser processing, a first processing may be performed on the remaining portion of the initial first doped layer located on the first doped parts 103, to convert the initial first doped layer 207 to the third doped parts 106. For example, the material of the third doped parts 106 may be silicon oxide, the material of the initial first doped layer 207 may be amorphous silicon or polycrystalline silicon, and the first processing may be a thermal oxidation processing to convert the initial first doped layer located on the first doped parts 103 to the third doped parts. For example, the material of the third doped parts 106 may be silicon nitride, the material of the initial first doped layer 207 may be amorphous silicon or polycrystalline silicon, and the first processing may be a nitriding processing to convert the initial first doped layer located on the first doped parts 103 to the third doped parts.

The third doped parts 106 made of silicon oxide or silicon nitride can not only provide an impurity absorption effect for the first doped parts 103, but also provide a passivation effect for the substrate 100.

In some embodiments, the texturing processing may be performed on the first surface exposed at the gaps 110 after the third doped parts 106 are formed. Since the third doped parts are formed on top surfaces of the first doped parts, the third doped parts may be used as a protective layer to reduce the corrosion of a texturing solution on the first doped parts, to ensure a better performance of the first doped parts.

Figure 14:
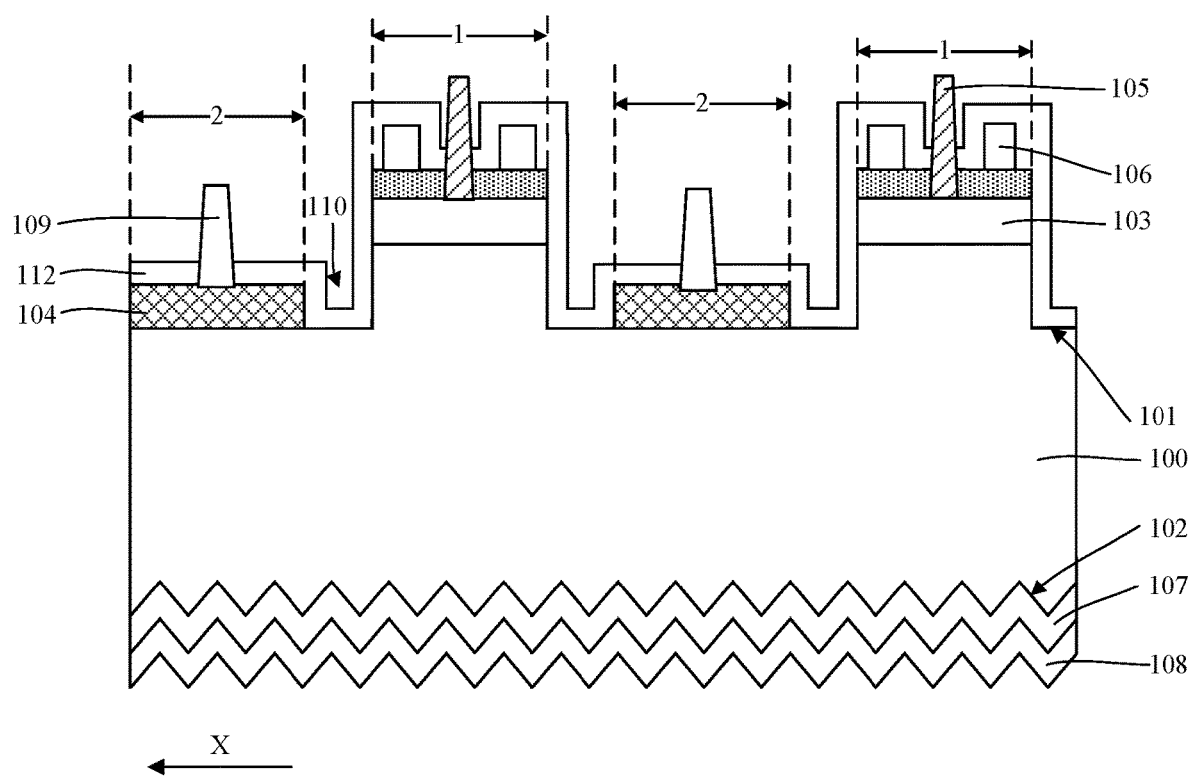
FIG. 14 is a schematic structural diagram corresponding to an operation for forming a second doped part and a third doped part in a method for manufacturing a solar cell according to an embodiment of the present disclosure.
Figure 20:
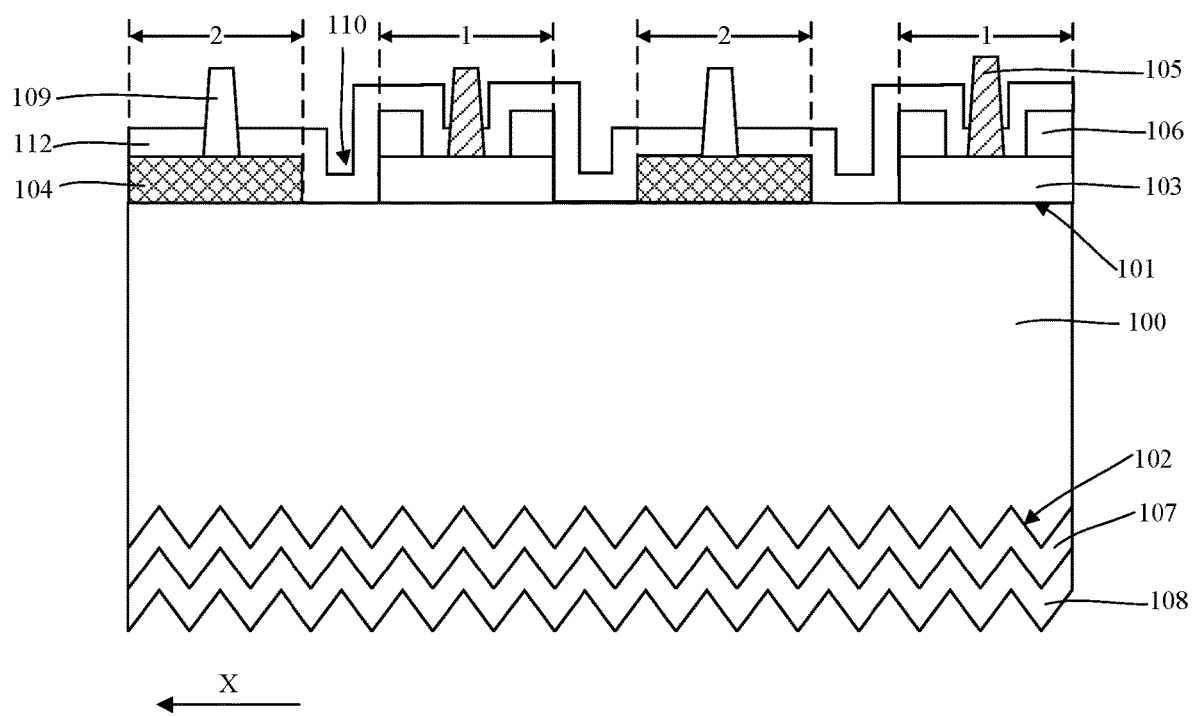
FIG. 20 is a schematic structural diagram corresponding to an operation for forming a second doped part and a third doped part in a method for manufacturing a solar cell according to an embodiment of the present disclosure.

FIG. 14 is a schematic structural diagram corresponding to an operation for forming second doped parts and third doped parts in a method for manufacturing a solar cell according to an embodiment of the present disclosure, and FIG. 20 is a schematic structural diagram corresponding to an operation for forming second doped parts and third doped parts in a method for manufacturing a solar cell according to another embodiment of the present disclosure.

Referring to FIG. 14 to FIG. 20, multiple first electrodes 105 are formed. The first electrodes 105 are located on the metal regions respectively and are in electrical contact with the first doped parts 103. The first electrodes 105 are separated from the third doped parts 106.

Multiple second electrodes 109 may also be formed in the operation for forming the first electrodes. The second electrodes 109 are located on the second doped parts 104 respectively and are in electrical contact with the second doped parts 104.

The second passivation layer 112 may be formed before forming the first electrodes 105 and the second electrodes. The second passivation layer covers the top surfaces of the third doped parts 106, the top surfaces of the second doped parts 104 and the top surfaces of the first doped parts 103 that are not covered by the third doped parts 106. The first electrodes 105 penetrate the second passivation layer 112 and are in electrical contact with the first doped parts 103, respectively. The second electrodes 109 penetrate the second passivation layer 112 and are in electrical contact with the second doped parts 104, respectively.

In some embodiments, the second passivation layer 112 may be formed before the above laser processing and after the initial first doped layer 207 is formed, the second passivation layer 112 covers the initial first doped layer 207. In the laser processing, while removing the portion of the initial first doped layer 207 on the metal region, the second passivation layer 112 in the metal region may also be removed to expose the top surface of the first doped part 103 corresponding to the metal region. In this way, no additional operations are required to perform laser grooving or sintering grooving on the second passivation layer 112 on the first doped part 103, the third doped part 106 can be formed and the top surface of the first doped part 103 corresponding to the metal region can be exposed through the laser processing, which is conducive to reducing the process cost and reducing the process operations.

Figure 21:
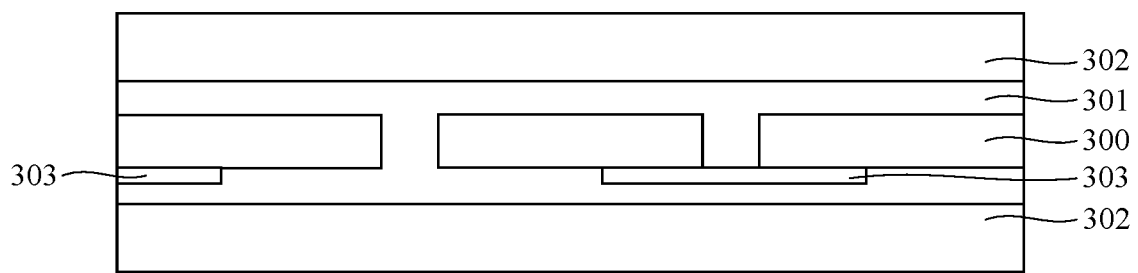
FIG. 21 is a schematic structural diagram of a photovoltaic module according to an embodiment of the present disclosure.

Accordingly, the embodiments of the present disclosure further provide a photovoltaic module. Reference is made to FIG. 21, FIG. 21 is a schematic structural diagram of a photovoltaic module according to an embodiment of the present disclosure. The photovoltaic module includes at least one cell string formed by connecting multiple solar cells 300 described above or by connecting multiple solar cells prepared by the method described above. The photovoltaic module includes at least one encapsulation layer 301 configured to cover surfaces of the at least one cell string, and at least one cover plate 302 configured to cover surfaces of the at least one encapsulation layer 301 away from the at least one cell string. The solar cells 300 are electrically connected in whole or in pieces to form multiple cell strings electrically connected in series and/or in parallel.

Specifically, in some embodiments, the multiple cell strings may be electrically connected to each other by conductive bands 303. The solar cell provided in the embodiment of the present disclosure is the IBC cell. The solar cell includes first electrodes 105 and second electrodes 109 located on the same side of the solar cell (as shown in FIG. 2). The first electrodes and the second electrodes have different polarities, and two adjacent solar cells on the same side are connected through the conductive bands.

In some embodiments, there are no gaps between the solar cells, that is, the adjacent solar cells overlap each other.

In some embodiments, the at least one encapsulation layer 301 includes a first encapsulation layer and a second encapsulation layer. The first encapsulation layer covers one of the front surface and the rear surface of the solar cell 300. The second encapsulation layer covers the other one of the front surface and the rear surface of the solar cell 300. Specifically, at least one of the first encapsulation layer and the second encapsulation layer may be an organic encapsulation layer such as a polyvinyl butyral (PVB) adhesive film, an ethylene-vinyl acetate copolymer (EVA) adhesive film, a polyethylene octene co-elastomer (POE) adhesive film and a polyethylene terephthalate (PET) adhesive film.

It should be understood that, the first encapsulation layer and the second encapsulation layer have a dividing line before a lamination process. After the lamination process, the dividing line does not exist between the first encapsulation layer and the second encapsulation layer in the formed photovoltaic module, the first encapsulation layer and the second encapsulation layer form the overall encapsulation layer 301.

In some embodiments, the at least one cover plate 302 may be a plate with a light transmission function such as a glass cover plate and a plastic cover plate. Specifically, the surface of the at least one cover plate 302 towards the encapsulation layer 301 may be a concave-convex surface, thereby increasing the utilization rate of the incident light. The at least one cover plate 302 includes a first cover plate and a second cover plate. The first cover plate is located on a side of the first encapsulation layer away from the at least one cell string, and the second cover plate is located on a side of the second encapsulation layer away from the at least one cell string.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It should be understood by the person of ordinary skill in the art that, the above embodiments are specific embodiments for implementing the present disclosure. In practice, the embodiments may be varied in form and detail without departing from the spirit and scope of the present disclosure. Any person skilled in the art may make various changes and modifications without departing from the spirit and scope of the present disclosure. Therefore, the protection scope of the present disclosure shall be subject to the scope defined in the claims of the present disclosure.

What is claimed is:

1. A solar cell, comprising:
   a substrate, having a first surface and a second surface opposite to the first surface, the first surface including first regions and second regions arranged alternatingly in a first direction;
   a plurality of first doped parts, a respective first doped part of the plurality of first doped parts being located on a corresponding first region of the first regions;
   a plurality of second doped parts, a respective second doped part of the plurality of second doped parts being located on a corresponding second region of the second regions, the respective second doped part being spaced apart from a first doped part adjacent to the respective second doped part in the plurality of first doped parts, the plurality of first doped parts being doped with a dopant element of a first conductivity type, and the plurality of second doped parts being doped with a dopant element of a second conductivity type different from the first conductivity type;
   a plurality of first electrodes, a respective first electrode of the plurality of first electrodes being located on the respective first doped part and being in electrical contact with the respective first doped part; and
   a plurality of third doped parts, a respective third doped part of the plurality of third doped parts being located on a portion of a top surface of the respective first doped part, wherein the respective third doped part is located on one side of the respective first electrode, and is spaced apart from the respective first electrode;
   wherein the plurality of third doped parts is doped with a dopant element of the second conductivity type,
   on the respective first doped part, the respective third doped part is located on one side of the first electrode adjacent to the respective third doped part in the first direction; and a ratio of a width of the respective third doped part to a width of the respective first doped part in the first direction ranges from 0.05:1 to 0.5:1.

2. The solar cell according to claim 1, wherein on the respective first doped part, two third doped parts in the plurality of third doped parts are located on two opposite sides of the respective first electrode in the first direction.

3. The solar cell according to claim 2, wherein a ratio of a first width to a width of the respective third doped part in the first direction ranges from 0.23:1 to 68:1, and the first width is a distance between the adjacent third doped parts on the respective first doped part in the first direction.

4. The solar cell according to claim 1, wherein the respective third doped part has a thickness equal to a thickness of the respective second doped part.

5. The solar cell according to claim 1, wherein there is a gap arranged between the first doped part and the second doped part which are adjacent to each other, and a portion of the first surface is exposed in the gap.

6. The solar cell according to claim 5, wherein
in a thickness direction of the substrate, the first surface corresponding to the first regions is level with the first surface corresponding to the second regions; or
in the thickness direction of the substrate, the first surface corresponding to the first regions is not level with the first surface corresponding to the second regions, and a first height of the first surface corresponding to the first regions with respect to the second surface is greater than a second height of the first surface corresponding to the second regions with respect to the second surface.

7. The solar cell according to claim 1, wherein
in a thickness direction of the substrate, the first surface corresponding to the first regions is not level with the first surface corresponding to the second regions, a first height of the first surface corresponding to the first regions with respect to the second surface is greater than a second height of the first surface corresponding to the second regions with respect to the second surface; and
there is a gap arranged between at least a portion of the first doped parts and the second doped parts which are adjacent to each other.

8. The solar cell according to claim 1, further comprising an insulating layer located between the plurality of third doped parts and the plurality of first doped parts.

9. The solar cell according to claim 8, wherein material of the insulating layer includes silicon glass material doped with a dopant element of the first conductivity type.

10. The solar cell according to claim 1, wherein the plurality of third doped parts and the plurality of second doped parts are made of a same material.

11. The solar cell according to claim 1, wherein the substrate is provided with a textured structure on the second surface.

12. The solar cell according to claim 1, wherein the first surface is a polished surface.

13. The solar cell according to claim 1, further comprising a front surface field formed on the second surface, and having a same conductive type as the substrate.

14. The solar cell according to claim 13, further comprising a first passivation layer located on a surface of the front surface field away from the substrate.

15. A photovoltaic module, comprising:
at least one cell string formed by connecting a plurality of solar cells according to claim 1;
at least one encapsulation layer configured to cover surfaces of the at least one cell string; and
at least one cover plate configured to cover surfaces of the at least one encapsulation layer away from the at least one cell string.

* * * * *